United States Patent
Okada

[11] Patent Number: 6,031,068
[45] Date of Patent: Feb. 29, 2000

[54] POLYIMIDE COMPOSITION AND BASE TAPE FOR TAB CARRIER TAPE AND FLEXIBLE PRINTED CIRCUIT BOARD MADE FROM SAID COMPOSITION

[75] Inventor: Kohji Okada, Otsu, Japan

[73] Assignee: Kanegafuchi Kagaku Kogyo Kabushiki Kaisha, Osaka, Japan

[21] Appl. No.: 09/177,375

[22] Filed: Oct. 23, 1998

[30] Foreign Application Priority Data

Oct. 23, 1997 [JP] Japan ................................ 9-290601
Oct. 23, 1997 [JP] Japan ................................ 9-290602
Oct. 23, 1997 [JP] Japan ................................ 9-290603

[51] Int. Cl.$^7$ ........................... C08G 73/10; C08L 79/08
[52] U.S. Cl. ........................ 528/353; 528/125; 528/128; 528/170; 528/171; 528/172; 528/173; 528/174; 528/176; 528/183; 528/175; 528/188; 528/220; 528/226; 528/229; 528/350; 528/352; 528/185
[58] Field of Search .................... 528/125, 128, 528/170, 171, 172, 173, 174, 175, 176, 183, 185, 188, 220, 226, 229, 350, 352, 353

[56] References Cited

U.S. PATENT DOCUMENTS

| | | | |
|---|---|---|---|
| 5,096,998 | 3/1992 | Manos | 528/353 |
| 5,175,240 | 12/1992 | Kreuz et al. | 528/353 |
| 5,196,500 | 3/1993 | Kreuz et al. | 528/125 |
| 5,219,977 | 6/1993 | Kreuz | 528/125 |
| 5,300,619 | 4/1994 | Okada et al. | 528/170 |

*Primary Examiner*—P. Hampton-Hightower
*Attorney, Agent, or Firm*—Pillsbury Madison & Sutro, LLP

[57] ABSTRACT

The object of the present invention is to provide polyimide composition having such excellent property as low water absorption and low hygroscopic swelling, and a base tape for a TAB carrier tape and a FPC.

The another object of the present invention is to provide polyimide composition comprising polyimide consisting of a repeating unit of the general formula (1):

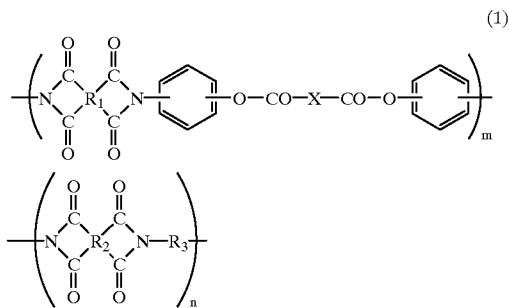

The further object of the present invention is to provide a base tape for a TAB carrier tape containing polyimide film made from said polyimide composition as a base film and a FPC containing polyimide film made from said polyimide composition as an insulating material.

8 Claims, No Drawings

POLYIMIDE COMPOSITION AND BASE TAPE FOR TAB CARRIER TAPE AND FLEXIBLE PRINTED CIRCUIT BOARD MADE FROM SAID COMPOSITION

FIELD OF THE INVENTION

The present invention relates to a novel polyimide composition and a method of producing it, more particularly, to a polyimide composition having proper flexibility, low water absorption and low hygroscopic swelling property.

The invention also relates to a base tape used in the tape automated bonding (hereinafter referred to as TAB) method and consisting of three-layer structure comprising a protective layer, an adhesive layer and an organic insulating film, and yet, the invention also relates to a novel flexible printed circuit board (hereinafter referred to as FPC).

BACKGROUND OF THE ART

There has been a demand for such an insulating material having excellent adhesive property, which can be used as high-density mounting materials such as semiconductor packages, COL and LOC packages, and MCMs (multi-chip modules), printed wiring materials such as multi-layer FPCs, and aerospace materials.

Generally, epoxy resin or acrylic resin has been mainly used for insulating adhesive material for electric parts/materials, because of its processability under low temperature (below 200° C.) and its easy handling characteristic. These adhesive materials have been also used to adhere a lead frame and an element in the course of manufacturing a semiconductor device.

However, these materials have various problems. For example, while they can be easily handled under low temperature, they have poor heat-resistance under high temperature. In addition, since they have been used in the form of solution, production process involves complexity. Further, adhesion of said adhesive materials requires a long curing process and gas is generated during the curing process. When said adhesive materials are used to adhere a lead frame and a semiconductor device, the generated gas stains the surface of this device, which degrades adhesive effect between the lead frame and the semiconductor device to lower the yield of products.

For these reasons, there has been a strong demand for a high-quality adhesive material to be used as a high-density mounting material, especially used in the case of manufacturing a semiconductor device. Also, there has been a great demand that these adhesive materials have high elastic modulus and low hygroscopic swelling coefficient, when they are used as a base film for a FPC or a TAB carrier tape or resin for composing a laminated sheet.

Concretely, the above-referred TAB carrier tape is internally loaded via sequential steps comprising the following: (1) slitting and punching; (2) laminating of copper foil and curing of adhesive agent; (3) forming of predetermined patterns including steps of resist coating, copper etching, resist stripping; (4) plating; (5) inner-lead bonding; (6) resin sealing; (7) punching; and (8) outer-lead bonding. In order to mount an LSI on a base tape for a TAB carrier tape, it is essential that base film should be of the one having high elastic modulus to sustain the LSI.

Heat is applied in the course of (2) laminating of copper foil and curing of adhesive agent, (5) inner-lead bonding, (6) resin sealing, and (8) outer-lead bonding. Therefore, if a base film of a base tape for a TAB carrier tape has a high coefficient of thermal expansion, it will cause various problems. For example, in the course of (5) inner-lead bonding, connecting position of the base film with the LSI deviates from the predetermined position, because of thermal expansion of the base film. Likewise, in the course of (8) outer-lead bonding, connecting position of the base film with the outer lead deviates from the predetermined position. Further, in the course of (2) laminating of copper foil, the base film is heated together with the copper foil. Therefore, if the base film of the base tape for a TAB carrier tape has different thermal expansion from the copper foil, thermal behavior is also different from each other to cause curling to be generated.

Accordingly, in the course of (5) inner-lead bonding, it is essential that coefficients of thermal expansion of the LSI (silicon wafer) and the base film of the base tape for a TAB carrier tape should be approximate to each other (the LSI has the coefficient of thermal expansion of $0.4 \times 10^{-5}$ °$C.^{-1}$). In the course of (8) outer-lead bonding, it is essential that coefficients of thermal expansion of the outer lead and the base film should be approximate to each other. In the course of (2) laminating of copper foil, it is essential that coefficients of thermal expansion of the copper foil and the base film should be approximate to each other (copper foil has the coefficient of thermal expansion of $1.6 \times 10^{-5}$ °$C.^{-1}$).

Based on the above requirements, it is preferable that a base film of a base tape for a TAB carrier tape should have high elastic modulus and its coefficient of thermal expansion should be about $0.4 \sim 2.6 \times 10^{-5}$ °$C.^{-1}$. An early materialization of such a base tape for a TAB carrier tape having a base film with the above-referred physical properties has thus been longed for. In the case of a FPC, the base film, which is a long insulating material, is produced via roll-to-roll sequential processes comprising (1) coating with adhesive material and drying, (2) laminating of copper foil and curing adhesive agent, and (3)forming of predetermined patterns comprising steps of resist coating, copper etching, and resist stripping. Generally, since a dimensional change can be seen during an etching step in the course of forming predetermined patterns, it has been necessary to anticipate such a change that may occur in the subsequent processes, when circuits are designed.

The above-referred dimensional change is generated by; (a) a dimensional change caused by absorbing and releasing moisture into and out of the base film used as an insulating material of the FPC, (b) distortion caused by the difference of thermal expansion between copper foil and the base film generated in the course of laminating copper foil, and (c) distortion caused by tension generated in the course of executing predetermined processes.

In the case that a coefficient of thermal expansion of the base film is constant, a dimensional change caused by the factor (b) can be easily anticipated when circuits are designed. The Dimensional change caused by the factor (c) can also be easily anticipated when circuits are designed, since it can easily be controlled by controlling tension in each of the sequential processes.

However, since a base film is washed and dried repeatedly in the FPC manufacturing process, it has been quite difficult to properly control the dimensional change caused by absorbing and releasing moisture into and out of the base film cited in the above factor (a). In addition, since conventional base films used as insulating materials had high coefficient of hygroscopic swelling, dimension of a base film was considerably changed by absorbing and releasing moisture in the FPC manufacturing processes, which caused a problem.

Polyimide having an excellent heat-resistant property among a wide variety of organic polymers has been extensively used in various fields ranging from the aerospace field to the electronic commnication fields. However, there has been a great demand for such kind of polyimide having not only an excellent heat-resistant property, but also various physical properties to solve above properties.

In order to achieve such polyimide which can solve the above problems, it is essential that low thermal expansive property should be materialized by way of forming a main-chain of polyimide as stiff as possible. Polyimide synthesized by the use of pyromellitic acid, which has the stiffest structure among all the existing acids, may easily achieve high elastic modulus. However, because of high polarization of imino group, polyimide can not gain a property of low water absorption. In order to lower water absorption, it might be possible to introduce fluorine into polyimide, however, the process may increase the production costs. Consequently, there has been actually no polyimide, which can contain satisfying physical properties including high elastic and low hygroscopic swelling coefficient.

OBJECTS AND SUMMARY OF THE INVENTION

As the result of our researches to remove the above disadvantages, we have eventually completed a novel polyimide composition having such excellent properties as low water absorption and low hygroscopic swelling, a method of producing a novel polyimide composition, and a base tape for a TAB carrier tape and a FPC containing a polyimide film obtained from said novel polyimide composition having the above-referred specific structure.

The present invention discloses polyimide composition having a water absorption rate of 1.6% or less and a hygroscopic swelling coefficient of 15 ppm or less, and comprising polyimide consisting of a repeating unit of the general formula (1):

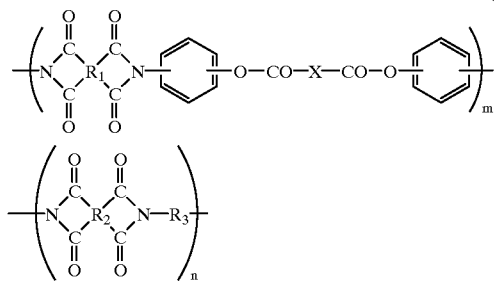

(1)

wherein $R_1$ and $R_2$ are tetravalent organic groups, and $R_3$ and X are bivalent organic groups, m is an integer of 1 or more, and n is an integer of 0 or more.

The present invention also discloses polyimide composition having a water absorption rate of 1.6% or less and a hygroscopic swelling coefficient of 15 ppm or less, and comprising polyimide consisting of a repeating unit of the general formula (1):

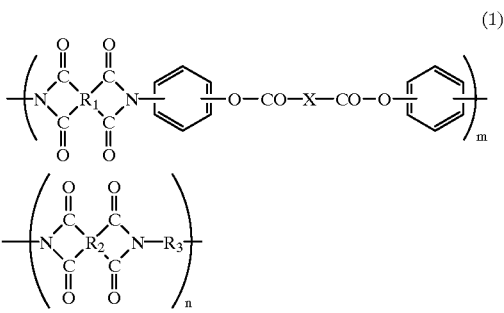

(1)

wherein $R_2$ is a tetravalent organic group, and $R_3$ and X are bivalent organic groups, m is an integer of 1 or more, n is an integer of 0 or more, and $R_1$ indicates one or more tetravalent organic groups selected from the group represented by the formula:

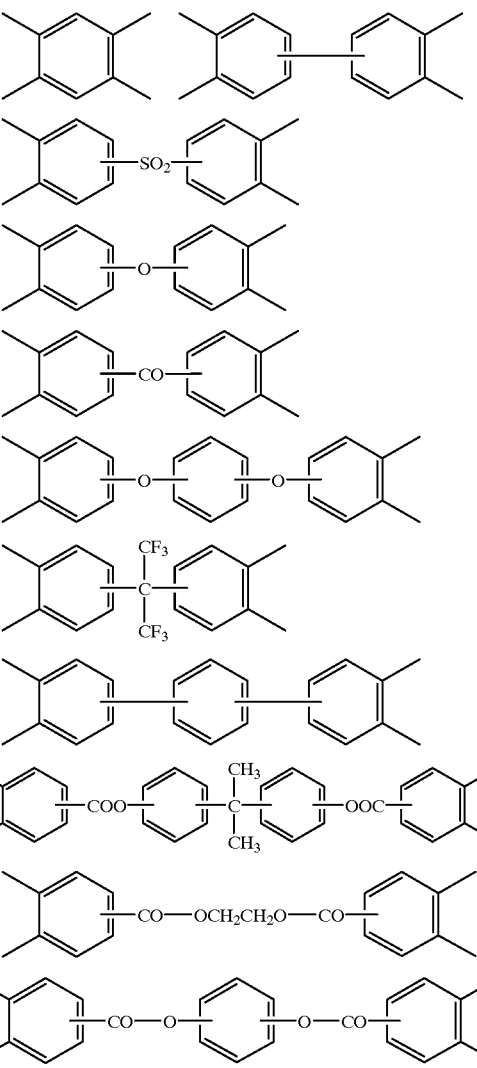

The present invention also discloses polyimide composition having a water absorption rate of 1.6% or less and a hygroscopic swelling coefficient of 15 ppm or less, comprising polyimide consisting of a repeating unit of the general formula (1):

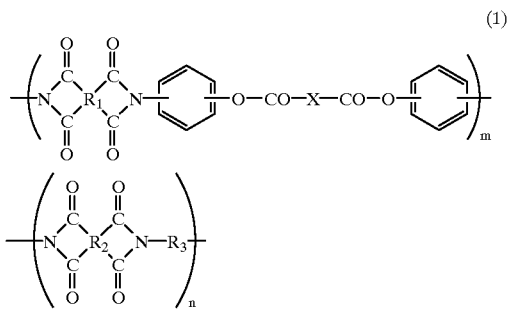

wherein $R_3$ and X are bivalent organic groups, m is an integer of 1 or more, n is an integer of 0 or more, and $R_1$ indicates one or more tetravalent organic groups selected from the group represented by the formula:

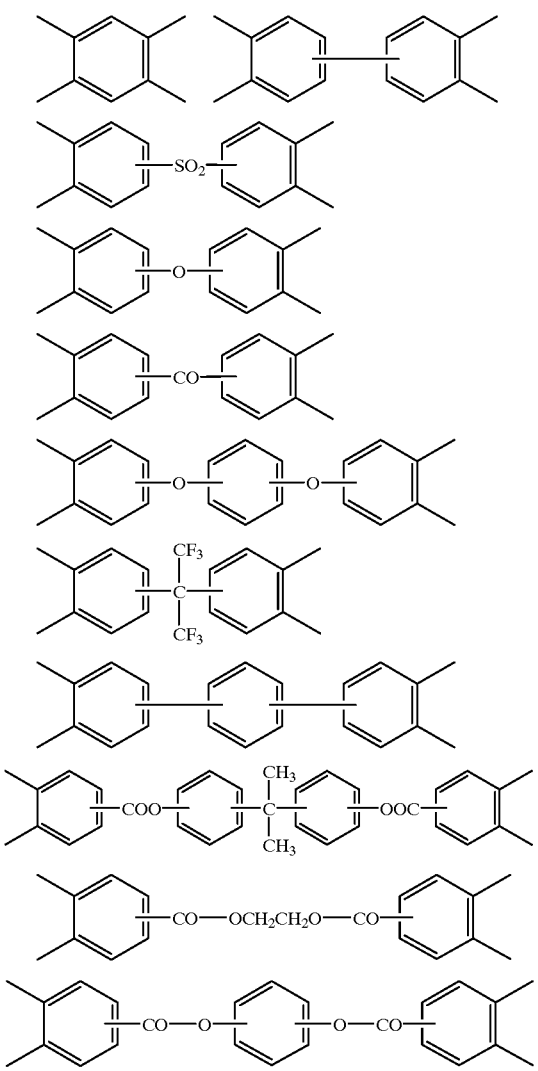

and $R_2$ indicates one or more tetravalent organic groups selected from the group represented by the formula:

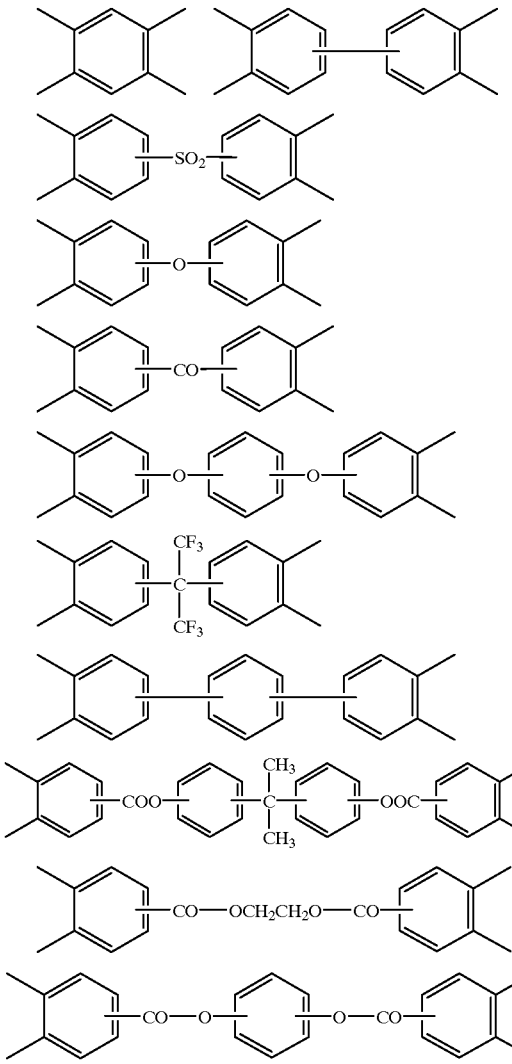

The present invention also discloses polyimide composition having a water absorption rate of 1.6% or less and a hygroscopic swelling coefficient of 15 ppm or less, and comprising polyimide consisting of a repeating unit of the general formula (1):

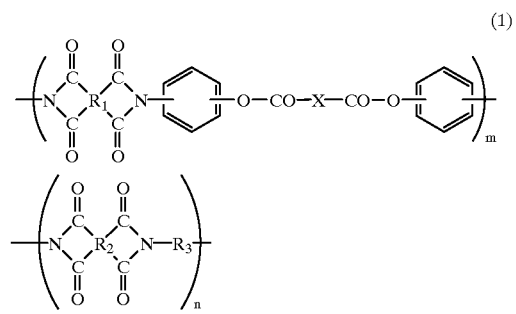

wherein $R_3$ is a bivalent organic group, $R_1$ indicates one or more tetravalent organic groups selected from the group represented by the formula:

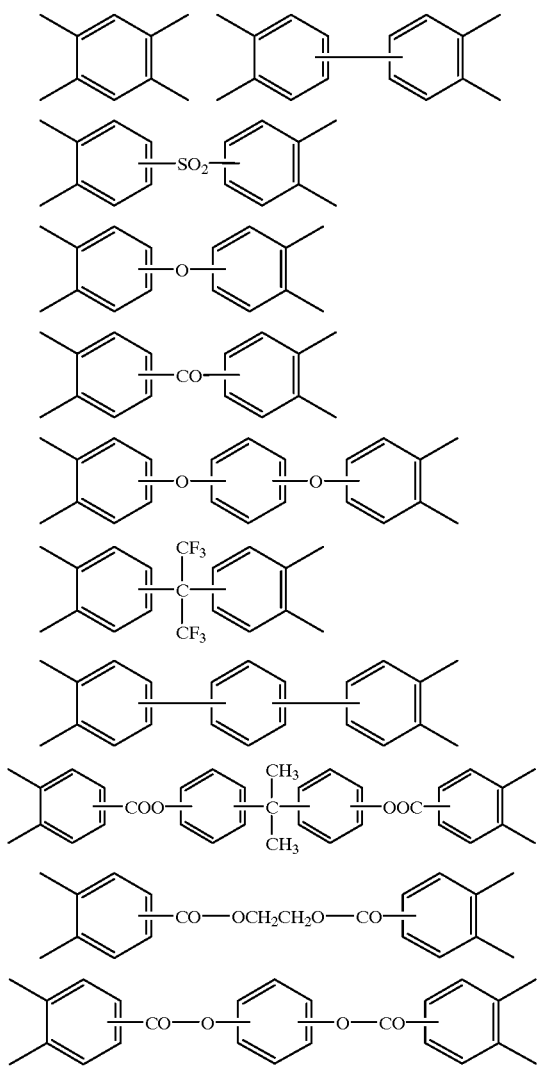
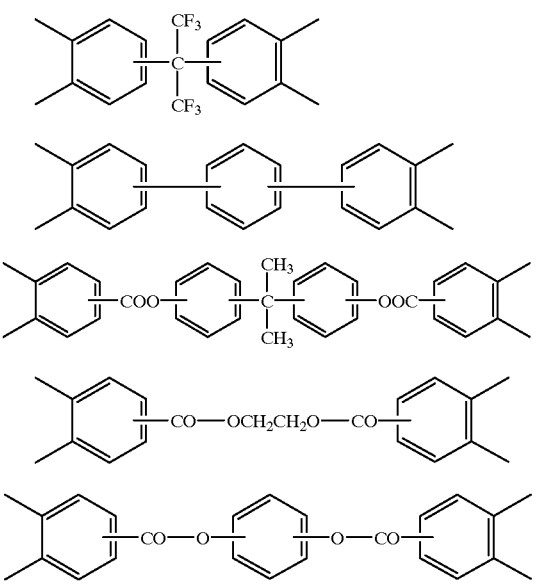
X indicates one or more organic groups selected by the formula:
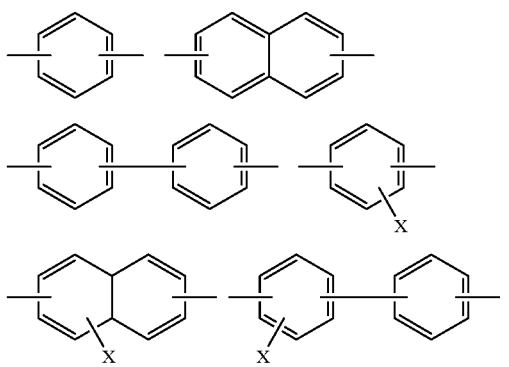
R₂ indicates one or more tetravalent organic groups selected from the group represented by the formula:
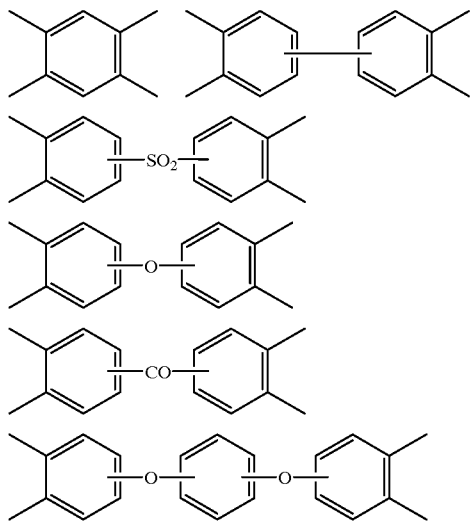
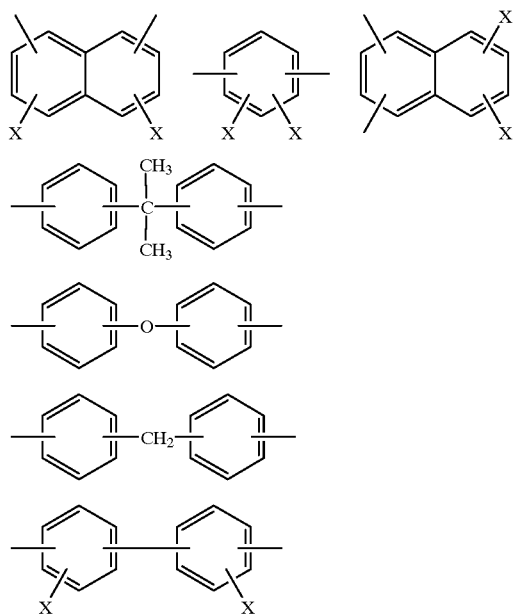

-continued

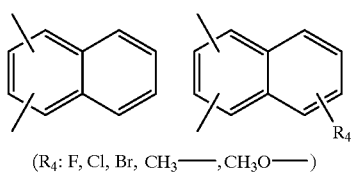

($R_4$: F, Cl, Br, $CH_3$—, $CH_3O$—)

m is an integer of 1 or more, and n is an integer of 0 or more.

The present invention further discloses polyimide composition having a water absorption rate of 1.6% or less and a hygroscopic swelling coefficient of 15 ppm or less, and comprising polyimide consisting of a repeating unit of the general formula (1):

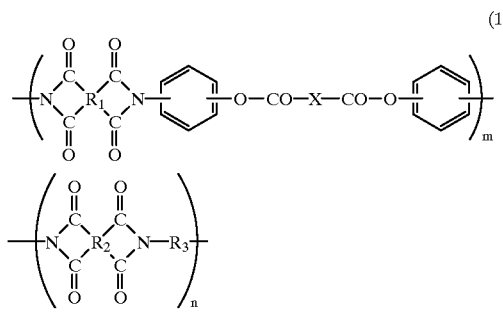
(1)

wherein $R_1$ indicates one or more tetravalent organic groups represented by the formula:

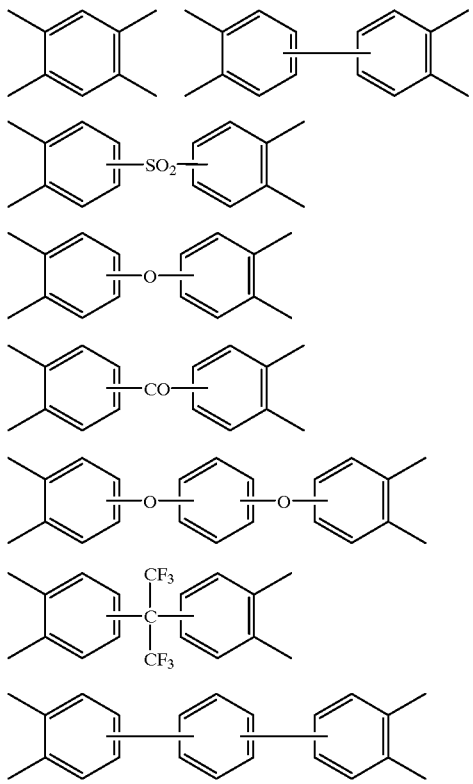

-continued

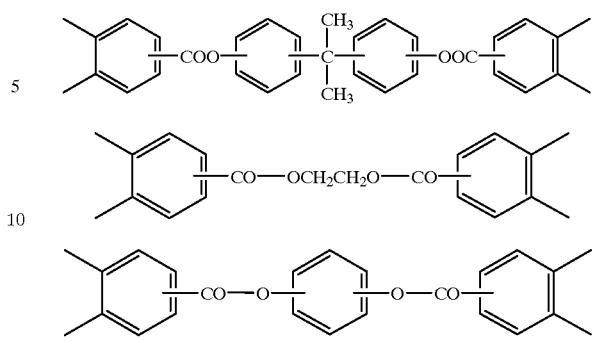

$R_2$ indicates one or more tetravalent organic groups represented by the formula:

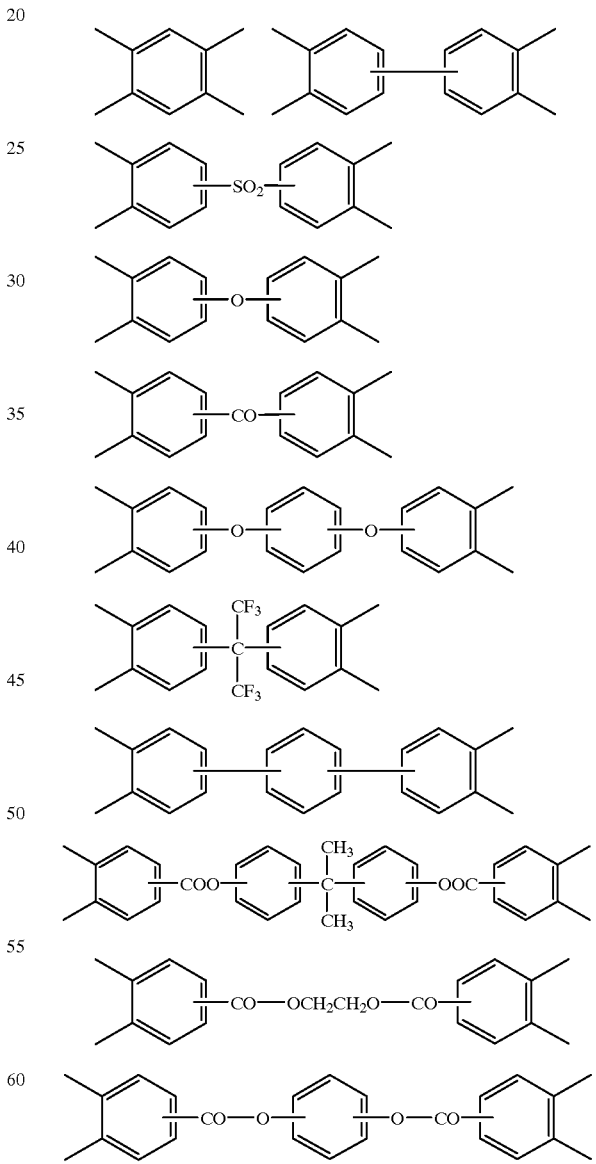

X is one or more organic groups represented by the formula:

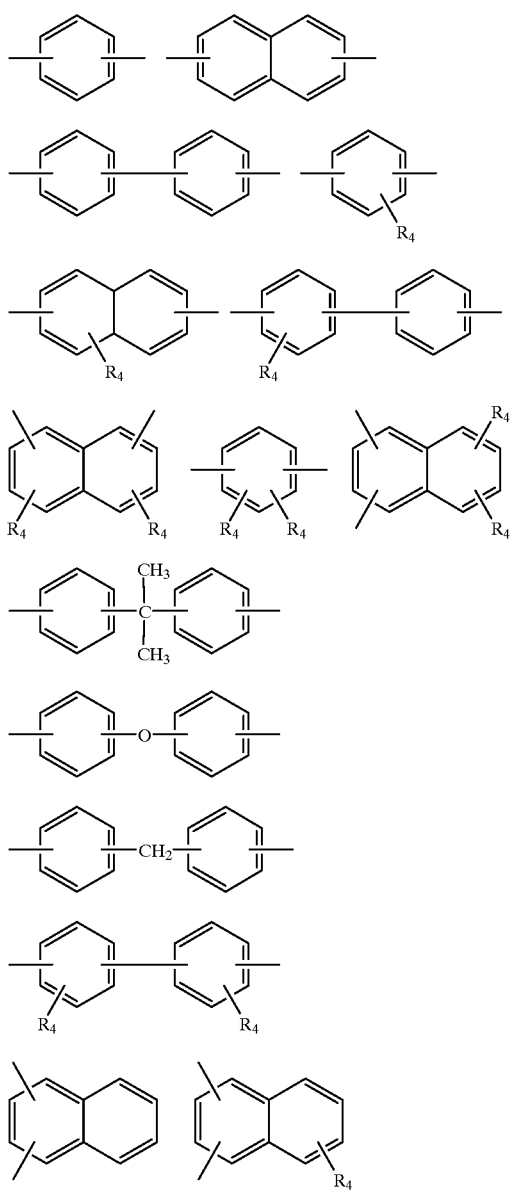
(R₄: F, Cl, Br, CH₃——, CH₃O——)
R₃ indicates one or more bivalent organic groups represented by the formula:
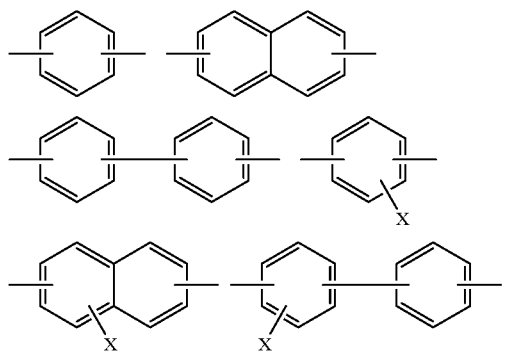
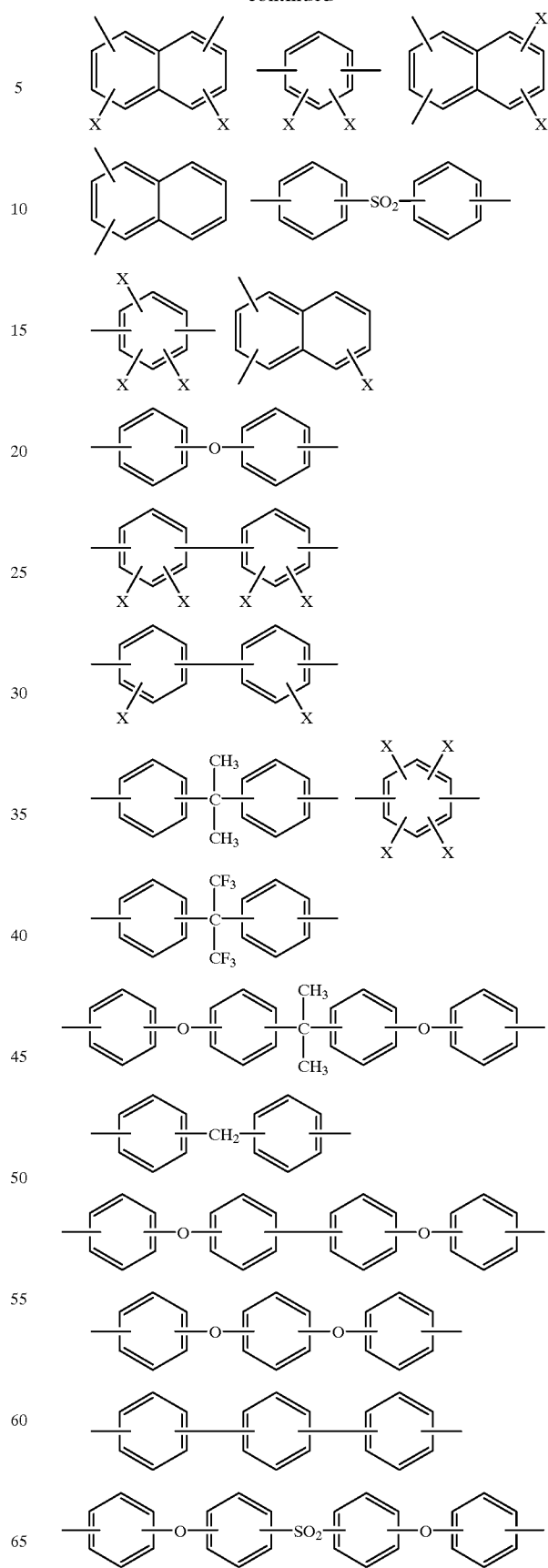

-continued

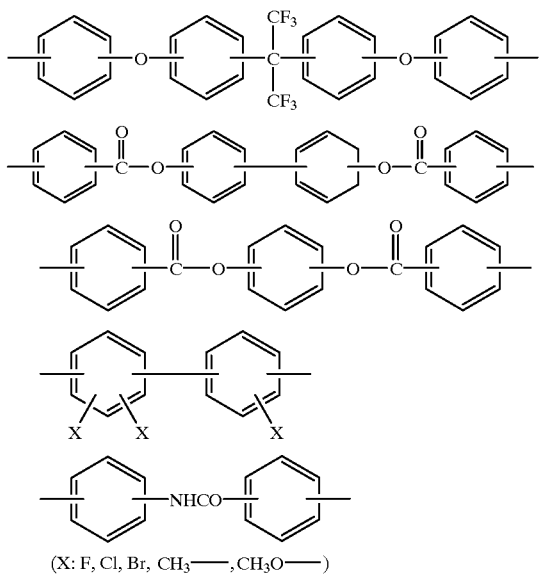

(X: F, Cl, Br, CH$_3$——, CH$_3$O——)

m is an integer of 1 or more, and n is an integer of 0 or more.

The present invention also discloses polyimide film comprising any of said polyimide compositions described above.

The present invention further discloses a base tape for a TAB carrier tape having adhesive layer and protective layer on the surface of said polyimide film.

The present invention discloses a FPC comprising at least a conductor and an insulating material consisting of said polyimide film.

Accordingly, those objects described below can be achieved by the present invention.

A general object of the present invention is to provide polyimide film having high elastic modulus, ideal linear coefficient of expansion, proper flexibility, low hygroscopic swelling property, and low water absorption, which is obtained from polyamide acid made from the diamine with a specific ester structure.

Another object of the present invention is to provide a base tape for a TAB carrier tape, which base film is a polyimide film having extremely high elastic modulus and linear coefficient of expansion not widely different from that of glass or metal.

A further object of the present invention is to provide a FPC containing polyimide film as an insulating material, which can be a suitable material for a FPC with high-density pattern since it has no bending or curling, or little dimensional change in the course of processing and mounting.

DESCRIPTION OF THE PREFERRED EMBODIMENTS

The polyimide composition related to the present invention essentially contains excellent physical properties such as low water absorption and low hygroscopic swelling. More specifically, the polyimide composition related to the present invention contains polyimide consisting of a repeating unit of general formula(1):

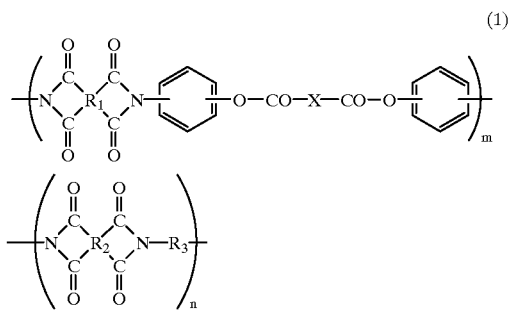

wherein $R_1$ and $R_2$ are tetravalent organic groups, and X and $R_3$ are bivalent organic groups. Concretely, $R_1$ is a tetravalent organic group selected from

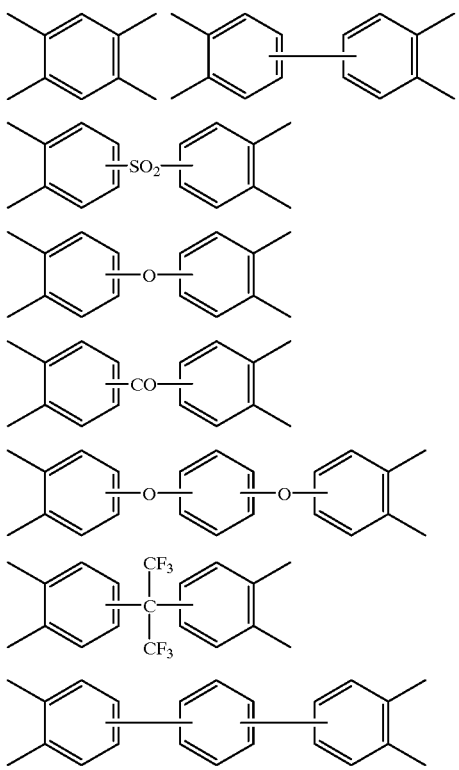

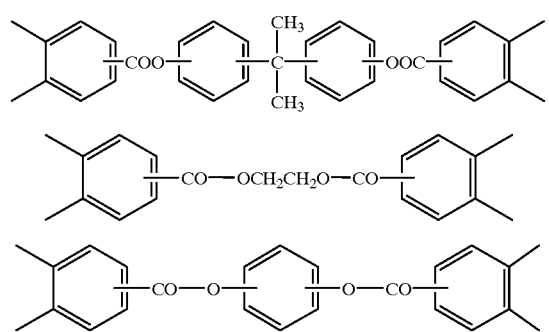

$R_2$ is a tetravalent organic group selected from
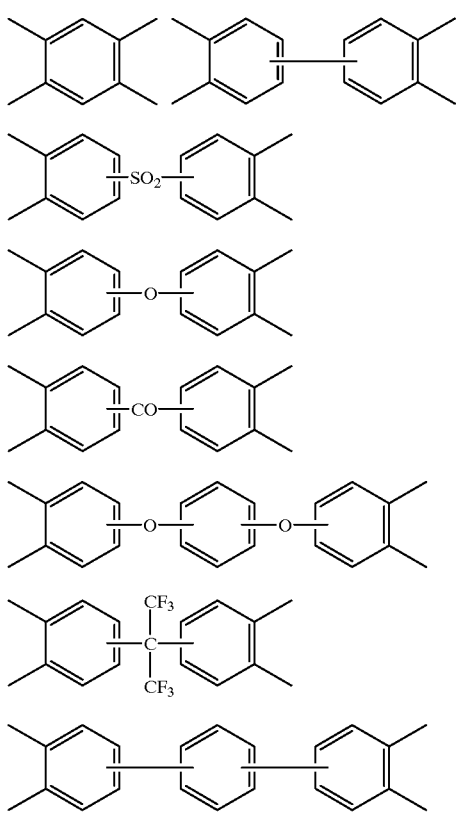
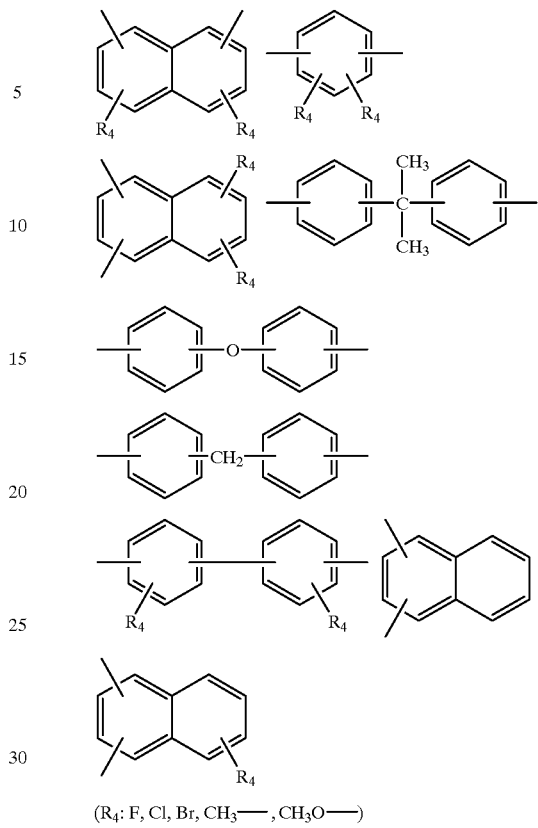
($R_4$: F, Cl, Br, $CH_3-$, $CH_3O-$)
and $R_3$ is a bivalent organic group selected from
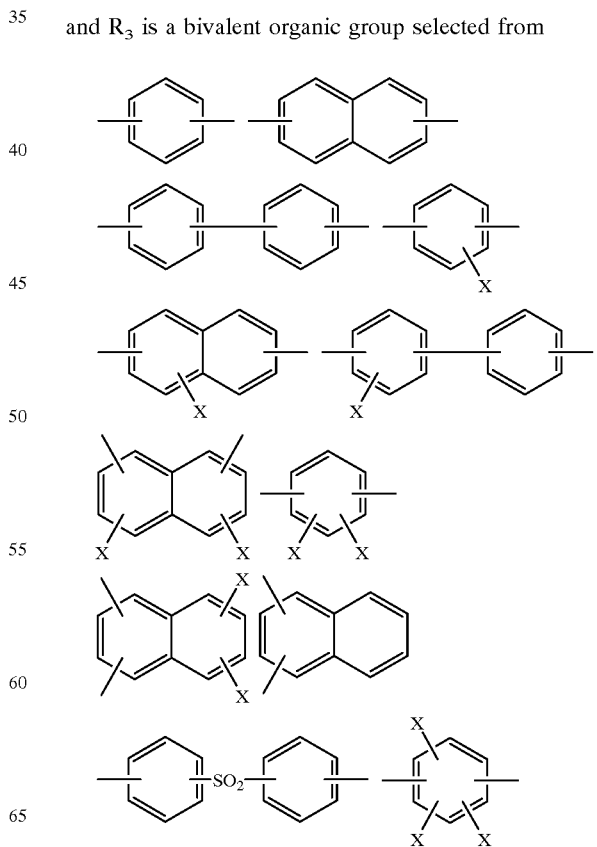
X is a bivalent organic group selected from
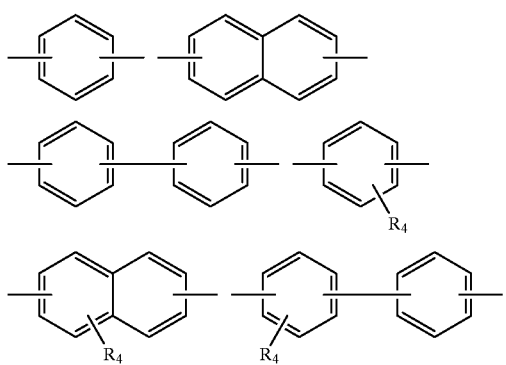

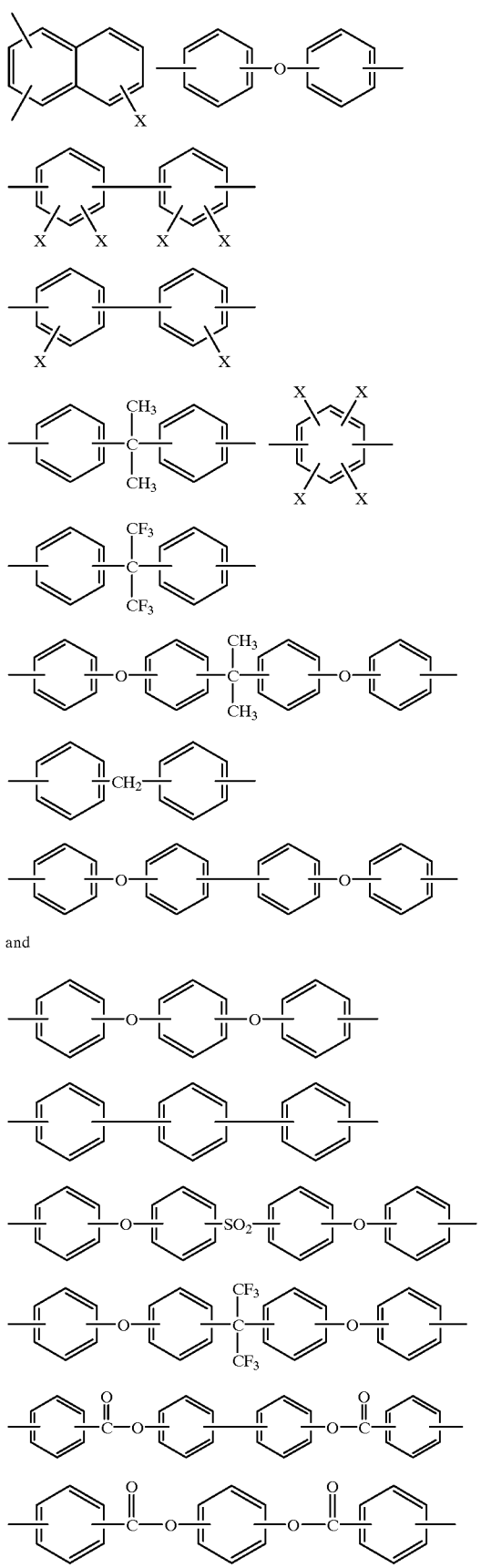

and

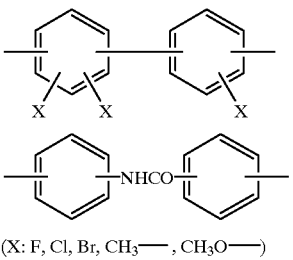

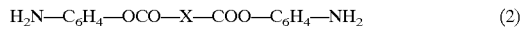

(X: F, Cl, Br, CH$_3$—, CH$_3$O—)

wherein m is an integer of 1 or more and n is an integer of 0 or more.

A method of producing the novel polyimide composition and polyimide film related to the present invention is described below.

The novel polyimide composition is obtained by dehydrating and cyclizing polyamide acid copolymer, which is a precursor of said polyimide. The solution of the polyamide acid is obtained by polymerizing substantially equimolecular amount of acid dianhydride and diamine component in organic polar solvent.

Following is a typical example of the process.

First, in an inert atmosphere such as argon, nitrogen and the like, one or more kinds of diamine represented by the general formula (2):

$$H_2N—C_6H_4—OCO—X—COO—C_6H_4—NH_2 \quad (2)$$

wherein X is bivalent organic group selected from

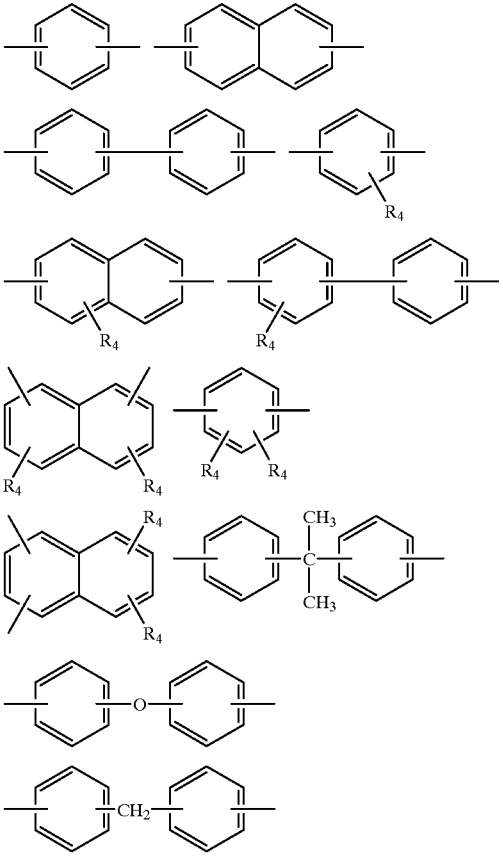

-continued

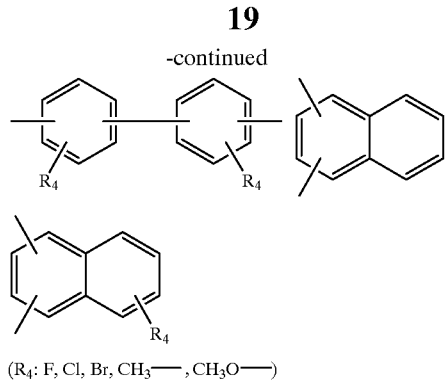

($R_4$: F, Cl, Br, $CH_3—$, $CH_3O—$)

and one more kinds of acid dianhydride selected from aromatic acid dianhydride represented by the general formula (3):

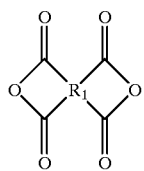
(3)

where $R_1$ is tetravalent organic group selected from

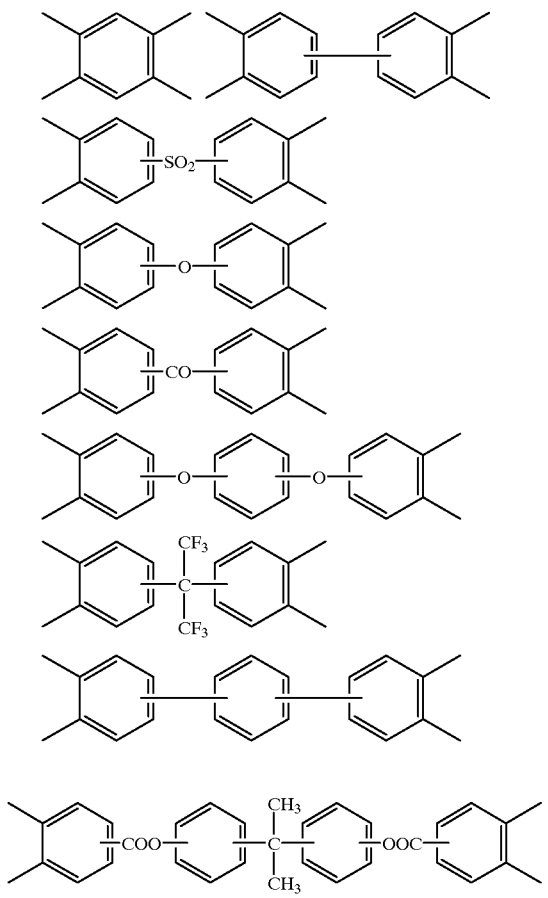

-continued

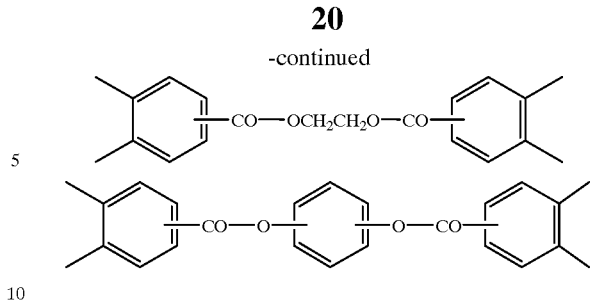

are dissolved or diffused in an organic polar solvent to make solution. Then, diamine compound represented by the general formula (4):

$$H_2N—R_3—NH_2 \quad (4)$$

wherein $R_3$ is a bivalent organic group selected from

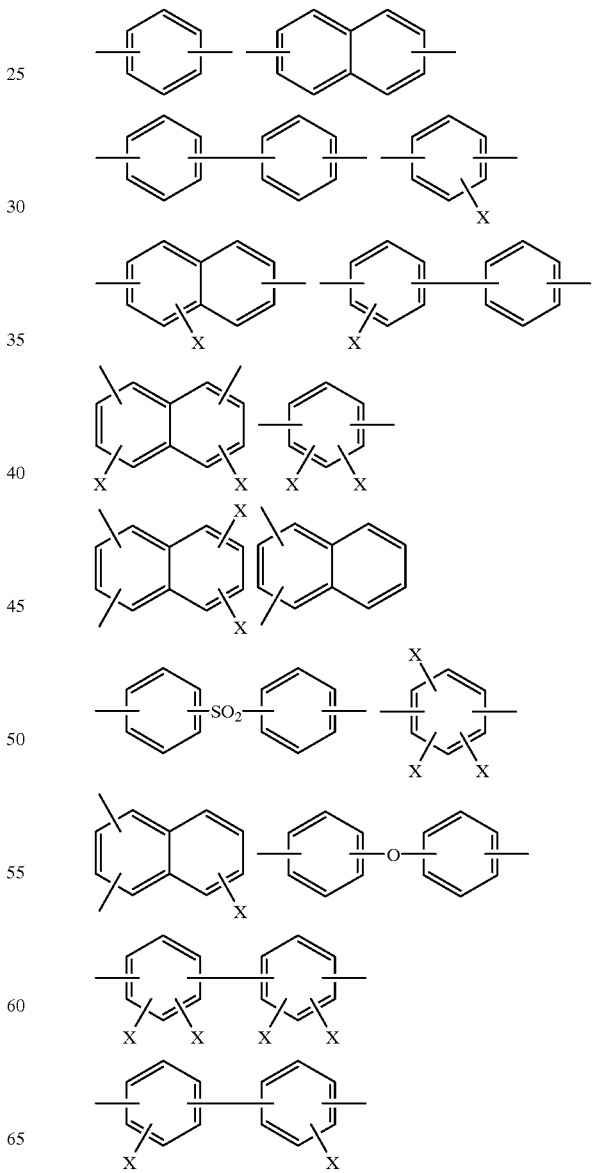

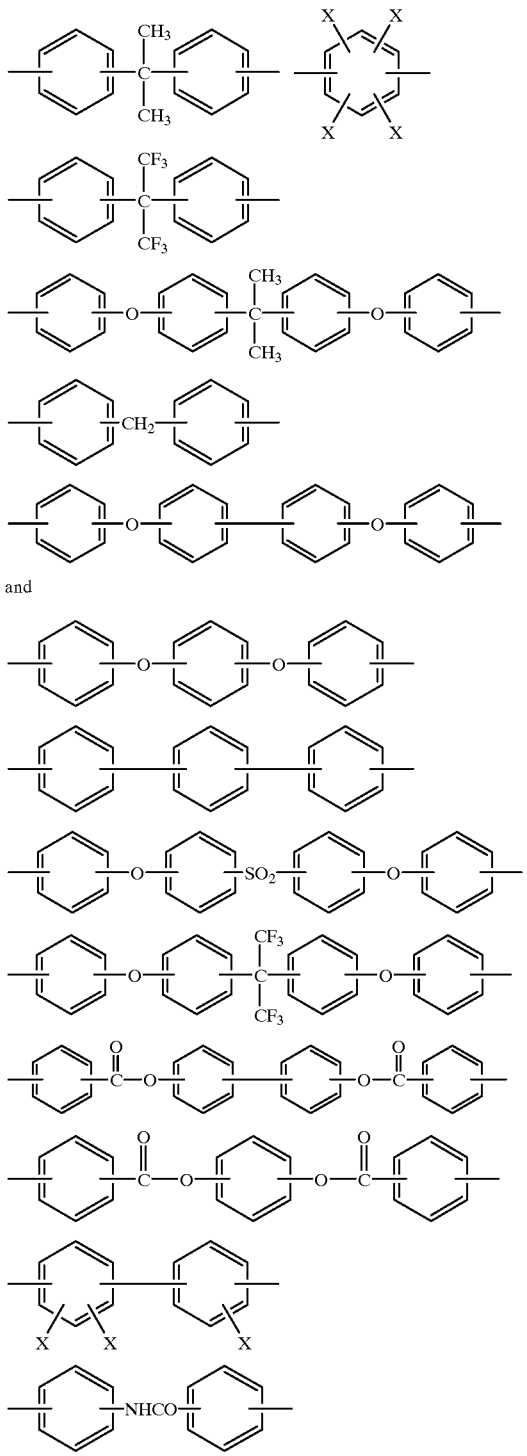

(X: F, Cl, Br, CH$_3$—, CH$_3$O—)

is added to the solution. The diamine compound added to the solution after being dissolved in an organic solvent is in the solid state, or in the liquid state or the slurry state. After that, one or more kinds of acid dianhydride selected from aromatic acid dianhydride represented by the general formula (5)

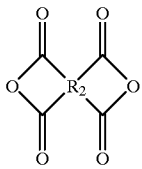

(5)

wherein R$_2$ is a tetravalent organic group selected from

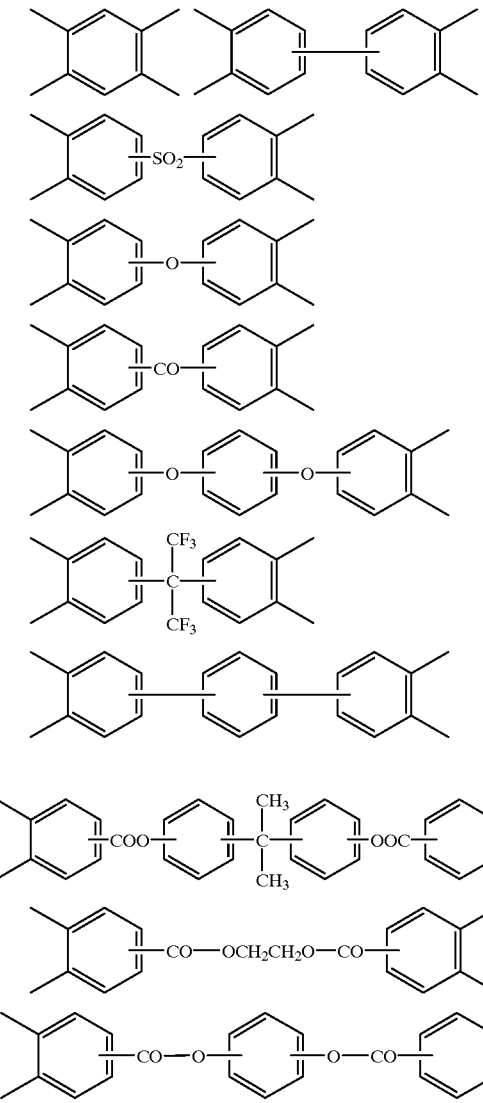

is added to the solution after being dissolved in an organic polar solvent to obtain a solution of polyamide acid copolymer.

To obtain a solution of polyamide acid copolymer, a procedure for adding respective monomer is as follows:

adding diamine component represented by the general formulas (2) or (4) to an organic polar solvent;

adding acid dianhydride represented by the general formula (3); and then adding one or more kinds of acid dianhydride selected from aromatic acid dianhydride represented by the general formula (5).

Another procedure for adding respective monomer is as follows:

adding diamine compound represented by the general formula (4) to an organic polar solvent in advance;

adding acid dianhydride component represented by the general formula (3); and then adding diamine component represented by the general formulas (2), and then adding one or more kinds of acid dianhydride selected from aromatic acid dianhydride represented by the general formula (5).

Further procedure for adding respective monomer is as follows:

adding diamine compound represented by the general formulas (2) and (4) to an organic polar solvent in advance; and then adding acid dianhydride component represented by the general formula (3) and one or more kinds of acid dianhydride selected form aromatic acid dianhydride represented by the general formula (5), simultaneously.

Even when reversing the above-referred procedures by way of first adding acid dianhydride, and then adding diamine component, substantially same solution can be obtained.

It is preferable that reaction temperature is adjusted to −20° C. to 60° C. and reaction time is for 30 minutes up to a maximum of 24 hours in the above procedures.

Preferably, a weight-average molecular weight is 10000~1000000. A polyimide film made of a polyamide acid with a weight-average molecular weight of less than 10000 is fragile and a vanish of a polyamide acid with a molecular weight of more than 100000 has too much viscosity, which makes it difficult to handle a finished film.

It is also possible to add a variety of organic additives, inorganic fillers, or reinforcements to a polyamide film in any processes of producing of polyimide film.

Typical examples of an organic polar solvent, which can be used in a reaction of the above-referred polyamide acid are as follows: sulfoxide solvents such as dimethylsulfoxide and diethylsulfoxide; formamide solvents such as N,N-dimethylformamide and N,N-diethylformamide; acetamide solvents such as N,N-dimethylacetamide and N,N-diethylacetamide; pyrrolidone solvents such as N-methyl-2-pyrrolidone and N-vinyl-2-pyrrolidone; phenolic solvents such as phenol, o-cresol, m-cresol, p-cresol, xylenol, phenyl halide, and catechol; or hexamethyl phospholamide, or γ-butyrolactone. It is preferable that any of the above-cited solvents be used on an individual basis or in the form of mixture. Further, aromatic hydrocarbon such as xylene or toluene may also be used in part.

Diamine component monomer used in the present invention is yielded by synthesizing dinitro compound and then reducing dinitro compound. Dinitro compound is synthesized by a reaction between aromatic diacid chloride and nitro phenol in the presence of pyridine in a solvent such as benzene or toluene or by a reaction between nitro phenol and aromatic dicarboxylic acid in the presence of catalyst such as p-nitrosulfonic acid for esterification.

Dinitro compound is yielded by a variety of reducing reaction using tin and hydrochloric acid, catalytic hydrogenation in the presence of active carbon, or a reduction using hydrazine.

For convenience in handling, the amount of polyamide acid dissolved in each of the above-cited organic polar solvents is preferably 5 to 40 wt %, more preferably 10 to 30 wt %.

The repeating number "m" of block unit in the polyimide composition represented by the general formula (1) is an integer of 1 or more and "n" is an integer of 0 or more. A range of n/m is defined to be $0 \leq n/m < 100$.

In order to materialize low water absorption, preferably, 10 mol % or more of diamine represented by the general formula (2)($0 \leq n/m < 9/1$) is contained in a diamine component. More preferably, 30 mol % or more of diamine ($0 \leq n/m < 7/3$) is contained.

In order to obtain the polyimide composition from a polyamide acid copolymer solution, any of the thermal dehydration method and the chemical dehydration method using dehydrating agent may be used. Compared to the polyimide composition obtained by the thermal dehydration method, the one obtained by the chemical dehydration method tends to have higher elastic modulus and small coefficient of thermal expansion. The novel polyimide composition of the present invention, which comprises polyimide having a specific structure, may obtain various physical characteristics within the scope of the invention by applying either or both of the thermal dehydration and the chemical dehydration of polyamide acid copolymer.

Next, a typical example related to the method of forming polyimide film by chemical dehydration is described below.

First, a solution is prepared by adding more than stoichiometric amount of dehydrating agent and catalytic amount of tertiary amine, and then the mixed solution is cast over a drum or an endless belt to form film. The formed film is then dried at a temperature of 150° C. or less for about 5 to 90 minutes to eventually obtain self-supporting polyamide acid film. Then, the formed film is stripped off from the supporting base, and then the edges of the film are secured. The film is then gradually heated up to a range of about 20° C. to 550° C., thus being imidized. After cooling, polyimide film of the present invention is obtained. Dehydrating agents used in this method are, for example, fatty acid anhydride such as acetic anhydride and aromatic acid anhydride. Catalysts used in the present invention are, for example, aliphatic tertiary amines such as triethylamine, aromatic tertiary amines such as dimethylaniline, and heterocyclic tertiary amines such as pyridine, picoline, and isoquinoline.

In the case of the method of forming polyimide film by thermal dehydration, a polyamide acid solution is cast over a supporting plate, organic film such as polyimide and PET, or a supporting base such as a drum or an endless belt to form film. Then, the formed film is thermally dried by applying the same sequential steps as is done for the above-referred chemically dehydrating method and thus polyimide film is obtained.

In the general formula (2) of a diamine compound of the present invention, a structure of X is preferably a p-benzene derivative, a p-biphenyl derivative, a 1,4-naphtalene or 2,6-naphtalene.

Applying a diamine having the structure described above makes it possible to obtain polyimide film, which is characterized by high elastic modulus, low water absorption rate, the Tg of 400° C. or more and low hygroscopic swelling, and can be used as a base film of FPC, a base tape for a TAB carrier tape, or a base film of a laminated board.

Introduction of the functional group such as o- or m-benzene group, biphenyl derivative group(except p-position), and naphthalene group (except 1,4- and 2,6-)to the terms of X of those diamine components shown in general formula (2) used for the present invention, makes it possible to produce a polyimide film having excellent adhesive property, a Tg of 400° C. or less, low water absorption and low hygroscopic swelling property, thus polyimide film of the present invention can be used as high-density mounting materials such as semiconductor packages, COL and LOC packages, MCMs (multi-chip modules), printed wiring materials such as multi-layer FPC, and aerospace materials as well.

The polyimide composition and polyimide film consisting thereof, which are obtained by the above processes, may have high elastic modulus, properly linear coefficient of expansion, and proper flexibility. Furthermore, the polyimide composition and the polyimide film may have low water absorption rate of 1.6% or less, preferably 1.0% or less, or more preferably 0.5% or less. Further, the polyimide composition and polyimide film may have low hygroscopic swelling coefficient of 15 ppm or less, preferably 12 ppm or less, or more preferably 5 ppm or less. Accordingly, the polyimide composition and the polyimide film consisting thereof of the present invention can be used as electronic parts and materials including base tapes for TAB carrier tapes and FPCs, and aerospace materials.

Next, a method of producing a base tape for a TAB carrier tape is described below.

Generally, polyimide film used as a base tape for TAB carrier tape in the present invention has a thickness of 25 μm to 180 μm. However, a thickness of the film is not limited by the above. Considering convenience in handling, sufficient strength of polyimide film and demand for thinner film to facilitate down-sizing of product, polyimide film having a thickness of 50 μm to 125 μm is preferably used.

As adhesive agents used for a base tape for a TAB carrier tape, epoxy resin, polyamide resin, phenolic resin, acrylic resin, polyimide resin, and rubber resin can be used for example. Any of these adhesive agents can be used individually or these adhesive agents can be used after being mixed with a solvent in various portions and additives such as a hardener and hardening accelerator can be additionally used as the need arises.

A protective film used as a protective layer for adhesive layer is not specifically limited if heat-resistant property of the film is sufficient enough to prevent the film from softening and denaturing in a drying process, however, it is preferable that polyester film such as polyethylene terephthalate or polyolefin film such as polypropylene is used.

A base tape for a TAB carrier tape related to the present invention is produced by the sequential steps comprising: (1) upper surface of a protective film is uniformly coated with previously compounded adhesive agent to form an adhesive layer having a thickness of 10 μm to 40 μm, preferably 15 μm to 30 μm; (2) A solution of adhesive agent is dried to cause the adhesive layer to be turned into semi-curing state (B-stage); and (3) the polyimide film of the present invention is superposed on the adhesive layer, and then both are thermally pressed and bonded at 20° C. to 180° C. by applying a minimum pressure of 0.1 kg/cm² to obtain a base tape for a TAB-oriented tape.

Next, method of producing a FPC of the present invention is described below:

(1) a base film consisting of a polyimide film of the present invention, which is functioned as an insulation material, is uniformly coated with previously compounded adhesive agent to form an adhesive layer having a final thickness of 10 μm to 100 μm, preferably, 15 μm to 30 μm;

(2) A solution of adhesive agent is dried to cause the adhesive layer to be turned into semi-curing state (B-stage).

(3) Copper foil is superposed on the adhesive layer, and then both are thermally pressed and bonded at 20° C. to 180° C. by applying a minimum pressure of 0.1 kg/cm². After that, hardening of the bonded objects are executed at a temperature at which the adhesive agent can be cured.

(4) The hardened objects are then coated with resist, circuits via exposure to light are developed, and then copper etching process is executed. Finally, resist is stripped off to obtain formation of a FPC.

The base tape for a TAB carrier tape and the FPC obtained above have no difference in the linear coefficient of expansion against metal or glass, and yet, since a polyimide film having extraordinarily high elastic modulus is used as a base film and an insulation material, neither bending nor curling is generated in the manufacturing process. Further, as a dimensional change that may occur in the course of processing and loading processes, the base tape for a TAB carrier tape and the FPC can serve as suitable materials for a tape carrier with multiple pins and/or high-density patterns.

EXAMPLES

The present invention will be more clearly understood by referring to the Examples below. However, the Examples should not be construed to limit the invention in any way.

Abbreviations shown in the Examples represent the following:

ODA . . . 4,4'-diaminodiphenylether;
BAPT . . . bis(4-aminophenyl)terephthalate;
BAPI . . . bis(4-aminophenyl)isophthalate;
BAPB . . . 4,4'-bis(4-aminophenoxy)biphenyl;
p-PDA . . . paraphenylene diamine;
PMDA . . . pyromelit acid anhydride;
s-BPDA . . . 3,3',4,4'-biphenyl tetracarboxylic acid;
ODPA . . . oxydiphthallic acid dianhydride;
DMF . . . N,N-dimethyl formamide; and
NMP . . . N-methyl-2-pyrolidon:

Physical properties of the produced polyimide film of the present invention were measured as described below.

(Coefficient of thermal expansion)

An average of coefficients of thermal expansion, which were measured in a stream of nitrogen at the temperature of 100° C. to 200° C. by applying an instrument TMA8140 (a product of Rigaku Corporation).

(Tg: glass transition temperature)

Tg is the temperature at inflection point shown in a chart of above-described coefficient of thermal expansion(X-axis: temperature, Y-axis: dimensional change).

(The rate of water absorption)

The rate of water absorption was determined by ASTM D570 and calculated by the following expression, wherein $W_1$ is weight of a film dried at 150° C. for 30 minutes and $W_2$ is weight of a film wiped free of surface moisture with a dry cloth after immersing it in distilled water for 24 hours.

The rate of water absorption(%)=$(W_2-W_1) \div W_1 \times 100$ (Coefficient of hygroscopic swelling)

Coefficient of hygroscopic swelling was calculated by the following expression, wherein $L_1$ is film dimension measured after leaving the film in the environmental tester at 50° C./30% Rh for 24 hours and $L_2$ is film dimension measured after leaving the film in the environmental tester at 50° C./80% Rh for 24 hours. hygroscopic swelling coefficient (ppm)=$(L_2-L_1) \div L_1 \div (80-30) \times 10^6$ (elastic Modulus)

Elastic modulus was determined by ASTM D882.

(Dimensional stability)

Dimensional stability of a base tape for a TAB carrier tape and a sample FPC was measured by a method described below.

Concretely, after removing a protective polyethylene terephthalate (herein after referred to as PET) film from a base tape for a TAB carrier tape composed of a base polyimide film, adhesive agent, and a protective PET film, the remaining component was laminated with a copper foil (a low-profile electrolytic copper foil VLP-3EC, a product of MITSUI MINING AND SMELTING CO., LTD.), and then heated and cured. After that, a pair of marking holes "a" and "b" were punched in the MD direction (machine manufacturing direction). These marking holes were used for measuring a rate of dimensional change. Initial value $l_1$ between the holes "a" and "b" was measured, and after etching overall surface of the copper foil, the value $l_2$ between the holes "a" and "b" was measured. Finally, the rate of the dimensional change before and after execution of the etching process was calculated by applying an formula shown below.

$$\text{THE RATE OF DIMENSIONAL CHANGE} = \frac{l_1 - l_2}{l_1} \times 100\%$$

Production Example 1

Synthesis of diamine component BAPT: (bis(4-aminophenyl) terephthalate:

First, 278 grams (2-mol) of p-nitrophenol, 400 ml of toluene, and 300 ml of pyridine were placed inside of a three-necked 3000-ml flask having a dropping funnel and a reflux condenser, and then the stored components were stirred at the temperature of about 80° C. After that, 203 grams (1.0-mol) of terephthalic acid chloride was dissolved in 500 ml of toluene, and then, the dissolved solution was dripped into the three-necked flask via the dropping funnel.

After dripping, the solution was refluxed with stirring for about 2 hours. After cooling off the solution, precipitation was filtered out, and finally white solid was yielded. The white solid was washed with 3 liters of water, and then dried. It was recrystallized from DMF solution, and 340 grams of needle-shaped white solid was yield. After that, 204 grams (0.5-mol) of the yielded white solid, 3.5 grams of activated palladium carbon, and 800 ml of DMAc were placed inside of the three-necked flask and then heated up to 70° C. Then, hydrogen was injected into the flask for reduction (consumption of hydrogen is 35 liters). After completing reductive reaction, solution was filtered and put in water. White precipitation was then filtered out and dried, and finally white solid was yielded. The yielded white solid was recrystallized from blended solution of alcohol and DMF, and 104grams of white solid component was yielded.

Production Example 2

Synthesis of diamine component BAPI: bis(4-aminophenyl) isophthalate 278 grams (2-mol) of p-nitrophenol, 400 ml of toluene, and 300 ml of pyridine were placed inside of a three-necked 3000-ml flask having a dropping funnel and a reflux condenser, and then the blended solution was stirred at the temperature of about 80° C. After that, 203 grams (1.0-mol) of isophthalic acid chloride was dissolved in 500 ml of toluene, and then dissolved solution was dripped into the three-necked flask via the dropping funnel.

After completing the dripping, the solution was refluxed with stirring for about 2 hours. After cooling off the solution, precipitation was filtered out to yield white solid. The white solid was washed with 3 liters of water and then dried. It was recrystallized from the blended solution of DMF and toluene, and 300 grams of needle-shaped white solid was yielded. After that, 204 grams (0.5-mol) of the yielded white solid, 3.5 grams of activated palladium carbon, and 800 ml of DMAc were placed inside of the three-necked flask and then heated up to 70° C. Hydrogen was injected into the flask for reduction(consumption of hydrogen is 35 liters). After completing reductive reaction, the solution was filtered and then put in water. White precipitation was filtered out and dried, and then white solid component was yielded. The yielded white solid was then recrystallized from blended solution of alcohol and DMF, and 100 grams of white solid component was yielded.

Example 1

2 chemical equivalent of BAPT in NMP and 1 chemical equivalent of p-PDA were placed inside the separable flask and then fully stirred at room temperature. 2.85 chemical equivalent of powdered s-BPDA was gradually added to the solution and then stirred for 40 minutes. 0.15 chemical equivalent of s-BPDA dissolved in NMP was trickled to the above solution. The monomers of diamines and aromatic tetracarboxylic acid dianhydride were dissolved in a concentration of 18 wt %. The solution was cooled off for about an hour with stirring, and NMP solution of polyamide acid was finally yielded.

After that, solution of polyamide acid was blended with acetic anhydride and β-picoline, and then the blend solution was cast over a glass sheet, and then dried at about 100° C. for about 5 minutes to make a polyamide acid film. The film was stripped off from the glass surface, and then secured to a supporting frame. After that, it was heated for dehydration and cyclization sequentially at about 100° C. for about 5 minutes, at about 200° C. for about 5 minutes, at about 300° C. for about 5 minutes, and at 400° C. for about 5 minutes. Finally polyimide film having a thickness of about 50 μm was yielded. Physical properties of the polyimide film are shown in Table 1.

TABLE 1

| | ELASTIC MODULUS kgf/mm$^2$ | COEFFICIENT OF THERMAL EXPANSION × 10$^{-6}$ °C.$^{-1}$ | RATE OF WATER ABSORPTION | Tg °C. | COEFFICIENT OF HYGROSCOPIC SWELLING(PPM) |
|---|---|---|---|---|---|
| EXAMPLE 1 | 900 | 7 | 0.5 | 400≦ | 4 |
| EXAMPLE 2 | 850 | 8 | 0.4 | 400≦ | 5 |
| EXAMPLE 3 | 550 | 20 | 0.3 | 400≦ | 5 |
| EXAMPLE 4 | 350 | 28 | 0.5 | 200 | 6 |
| EXAMPLE 5 | 750 | 15 | 0.5 | 400≦ | 7 |
| COMP. EXAM 1 | 300 | 32 | 3.0 | 400≦ | 28 |

Example 2

First, 2 chemical equivalent of BAPT in NMP and 1 chemical equivalent of p-PDA were placed inside the separable flask, and then fully stirred at room temperature. After that, 2 chemical equivalent of powdered s-BPDA was gradually added to the solution and then stirred for 40 minutes. 0.15 chemical equivalent of ODPA dissolved in NMP was trickled to the above solution. The monomers of diamines and aromatic tetracarboxylic acid dianhydride were dissolved in a concentration of 18 wt %. The solution was cooled off for an hour with stirring and NMP solution of polyamide acid was finally yielded. Firing condition was same as that of Example 1. Physical properties of the yielded polyimide film are shown in Table 1.

Example 3

First, 1 chemical equivalent of BAPT in NMP and 1 chemical equivalent of ODA were placed inside the separable flask, and then fully stirred at room temperature. After that, 1.85 chemical equivalent of powdered s-BPDA was gradually added to the solution. The monomers of diamines and aromatic tetracarboxylic acid dianhydride were dissolved in a concentration of 18 wt %. The mixed solution was cooled off for an hour with stirring, and NMP solution of polyamide acid was finally yielded. Firing condition was same as that of Example 1. Physical properties of the yielded polyimide film are shown in Table 1.

Example 4

1 chemical equivalent of BAPI in NMP and 1 chemical equivalent of ODA were placed inside the separable flask, and then fully stirred at room temperature. 1.85 chemical equivalent of powdered s-BPDA was gradually added to the solution, and then stirred for 40 minutes. 0.15 chemical equivalent of s-BPDA dissolved in NMP was trickled to the above solution. The monomers of diamines and aromatic tetracarboxylic acid dianhydride were dissolved in a concentration of 18 wt %. The mixed solution was then cooled off for an hour while being stirred, and NMP solution of polyamide acid was finally yielded. Firing condition was same as that of Example 1. Physical properties of the yielded polyimide film are shown in Table 1.

Example 5

Polyamide acid solution used in Example 1 was cast over a glass sheet, and then dried at about 100° C. for about an hour to make a polyamide acid film. The film was stripped off from the glass surface, and then secured to a supporting frame. After that, it was heated sequentially at about 150° C. for about 30 minutes, at about 200° C. for about 30 minutes, at about 300° C. for about 30 minutes, and at about 400° C. for about 30 minutes. The film was dehydrated, cyclized, and dried, and finally polyimide film having a thickness of about 50 $\mu$m was yielded. Physical properties of the yielded polyimide film are shown in Table 1.

Comparative Example

In the same way as Example 1, an equal mol of PMDA and ODA was used to yield polyimide film. Physical properties of the polyimide film are shown in Table 1.

Example 6

2 chemical equivalent of BAPT in NMP and 1 chemical equivalent of ODA were placed inside the separable flask, and then fully stirred at room temperature. 2.85 chemical equivalent of powdered s-BPDA was gradually added to the solution and then stirred for 40 minutes. 0.15 chemical equivalent of s-BPDA dissolved in NMP was trickled to the above solution. The monomers of diamines and aromatic tetracarboxylic acid dianhydride were dissolved in a concentration of 18 wt %. The solution was cooled off for an hour with stirring, and NMP solution of polyamide acid was finally yielded. After that, the solution of polyamide acid was blended with acetic anhydride and β-picoline. The blended solution was cast over a glass sheet, and then dried at about 100° C. for about 5 minutes to make a polyamide acid film. The film was stripped off from the glass sheet and then secured to a supporting frame. After that, it was heated for dehydration and cyclization sequentially at about 100° C. for about 5 minutes, at about 200° C. for about 5 minutes, at about 300° C. for about 5 minutes, and at about 400° C. for about 5 minutes. Finally polyimide film having a thickness of about 50 $\mu$m was yielded. Physical properties of the polyimide film are shown in Table 2.

TABLE 2

| | ELASTIC MODULUS kgf/mm$^2$ | COEFFICIENT OF THERMAL EXPANSION × 10$^{-6}$ C.$^{-1}$ | RATE OF WATER ABSORPTION | RATE OF DINNENTIONAL CHANGE % | APPEARANCE | COEFFICIENT OF HYGROSCOPIC SWELLING(PPM) |
|---|---|---|---|---|---|---|
| EXAMPLE 6 | 750 | 16 | 0.4 | +0.02 | GOOD | 5 |
| EXAMPLE 7 | 700 | 18 | 0.3 | +0.02 | GOOD | 4 |
| EXAMPLE 8 | 550 | 20 | 0.3 | +0.03 | GOOD | 5 |
| EXAMPLE 9 | 700 | 15 | 0.3 | +0.03 | GOOD | 6 |
| EXAMPLE 10 | 650 | 20 | 0.5 | +0.04 | GOOD | 7 |
| COMP. EXAM 2 | 300 | 32 | 3.0 | -0.20 | CURLED | 28 |

Polyimide film, which surface was treated with release coating, was coated with an adhesive agent consisting of 31.4 wt % of bisphenol-A epoxy resin(E1001/a product of Yuka Shell Epoxy Kabushiki Kaisha), 6.3 wt % of cresol novolak epoxy resin(180H65/a product of Yuka Shell Epoxy Kabushiki Kaisha), 25.2 wt % of polyamide resin(M1276/a product of Elf Atochen Japan), 4.4 wt % of diamino diphenyl sulfone, 1.3 wt % of dicyandiamide, 22.0 wt % of toluene, and 9.4 wt % of isopropyl alcohol, so that a thickness of the adhesive agent after completing a drying process could be about 20 $\mu$m. The polyimide film coated with adhesive agent was dried at 150° C. for 10 minutes. The adhesive-coated surface of the polyimide film was then laminated with a copper foil (low-profile electrolytic copper foil VLP-3EC, a product of MITSUI MINING AND SMELTING CO., LTD.) at 120° C. After that, appearance was observed, and then the rate of dimensional change was measured in accordance with the above-described method. Result of the measurement of dimensional change is shown in Table 2.

Example 7

2 chemical equivalent of BAPT in NMP and 1 chemical equivalent of ODA were placed inside the separable flask and then fully stirred at room temperature. 2 chemical equivalent of powdered s-BPDA was gradually added to the solution, and then stirred for 40 minutes. 0.85 chemical equivalent of powdered ODA was gradually added to the solution, and then stirred for 40 minutes. Then, 0.15 chemical equivalent of ODPA dissolved in NMP was trickled to the solution. The monomers of diamines and aromatic tetracarboxylic acid dianhydride were dissolved in a concentration of 18 wt %. The solution was cooled off for about an hour with stirring, NMP solution of polyamide acid was finally yielded. Firing condition was same as Example 1. Physical properties of the polyimide film are shown in Table 2.

In the same way as Example 6, the adhesive-coated surface of the polyimide film was then laminated with a copper foil (low-profile electrolytic copper foil VLP-3EC, a product of MITSUI MINING AND SMELTING CO., LTD.). Then appearance was observed, and the rate of dimensional change after etching was measured in accordance with the above-described method. Result of the measurement is shown in Table 2.

Example 8

1 chemical equivalent of BAPT in NMP and 1 chemical equivalent of ODA were placed inside the separable flask, and then fully stirred at room temperature. 1.85 chemical equivalent of powdered s-BPDA was gradually added to the solution, and then stirred for 40 minutes. 0.15 chemical equivalent of s-BPDA dissolved in NMP was trickled to the solution. The monomers of diamines and aromatic tetracarboxylic acid dianhydride were dissolved in a concentration of 18 wt %. The solution was cooled off for an hour with stirring, and then NMP solution of polyamide acid was yielded. Firing condition was same as Example 1. Physical properties of the yielded polyimide film are shown in Table 2.

PET film, which surface was treated with release coating agent, was coated with the same adhesive agent as used in Example 6, so that a thickness of the adhesive agent after completing a drying process could be 20 $\mu$m. After that, the above PET film was dried at 150° C. for 10 minutes, and then the PET film coated with adhesive agent was slit into 26 mm-wide-strips. The 26 mm-wide-strip of PET film was bonded together with 35 mm-wide strips of polyimide film at the temperature of 40° C., thus a base tape for a TAB carrier tape was obtained.

After removing a PET tape of the PET film from the base tape for a TAB carrier tape, adhesive-coated surface of the polyimide film was laminated with a copper foil at 120° C. The appearance was observed, and then the rate of dimensional change after etching was measured in accordance with the above-described method. Result of the measurement is shown in Table 2.

Example 9

2 chemical equivalent of BAPB in NMP and 1 chemical equivalent of ODA were placed inside the separable flask, and then fully stirred at room temperature. 2.85 chemical equivalent of powdered s-BPDA was gradually added to the solution, and then stirred for 40 minutes. 0.15 chemical equivalent of s-BPDA dissolved in NMP was trickled to the solution. The monomers of diamines and aromatic tetracarboxylic acid dianhydride were dissolved in a concentration of 18 wt %. The solution was then cooled off for an hour with stirring, and NMP solution of polyamide acid was finally yielded. Firing condition was same as Example 1. Physical properties of the yielded polyimide film are shown in Table 2.

In the same way as Example 8, a base tape for a TAB carrier tape was produced by the use of the yielded polyimide film. After removing a PET film, the adhesive-coated surface of the polyimide film was laminated with a copper foil. The appearance was observed, and then the rate of dimensional change after etching was measured in accordance with the above-described method. Result of the measurement is shown in Table 2.

Example 10

Polyamide acid solution used for implementing Example 6 was cast over a glass sheet, and then dried at about 100° C. for about an hour. The polyamide acid film was stripped off from the glass sheet, and then secured to a supporting frame. The fixed film was heated for dehydration and cyclization sequentially at about 150° C. for about 30 minutes, at about 200° C. for about 30 minutes, at about 300° C. for about 30 minutes, and at 400° C. for about 30 minutes. Finally polyimide film having a thickness of about 50 $\mu$m was yielded. Physical properties of the polyimide film are shown in Table 2.

In the same way as Example 8, a base tape for a TAB carrier tape was produced by the use of the yielded polyimide film. After removing a PET film, the base tape for a TAB carrier tape was laminated with a copper foil. The appearance was observed, and the rate of dimensional change was measured. Result of the measurement is shown in Table 2.

Comparative Example 2

Applying the same method as was done in Example 1, polyimide film was yielded by the use of an equal mol of PMD and ODA. Physical properties of the yielded polyimide film are shown in Table 2.

In the same way as Example 8, a base tape for TAB carrier tape was produced by the use of the yielded polyimide film. After removing a PET film, the base film for a TAB carrier tape was laminated with a copper foil. The appearance was observed, and the rate of dimensional change was measured. Result of the measurement is shown in Table 2.

What is claimed is:

1. Polyimide composition having a water absorption rate of 1.6% or less and a hygroscopic swelling coefficient of 15 ppm or less, and comprising polyimide consisting of a repeating unit of the general formula (1):

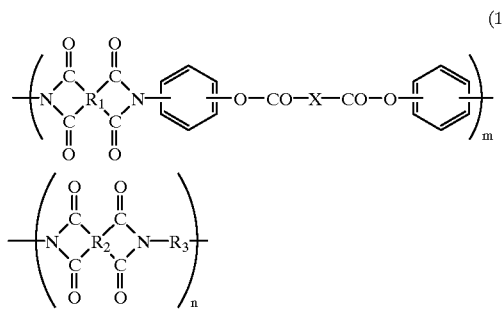

(1)

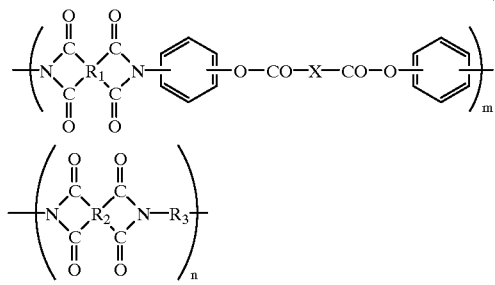

wherein $R_1$ and $R_2$ are tetravalent organic groups, and $R_3$ and X are bivalent organic groups, m is an integer of 1 or more, and n is an integer of 0 or more.

2. Polyimide composition having a water absorption rate of 1.6% or less and a hygroscopic swelling coefficient of 15 ppm or less, and comprising polyimide consisting of a repeating unit of the general formula (1):

(1)

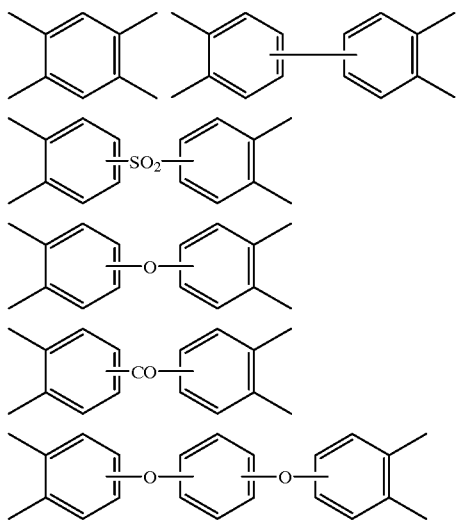

wherein $R_2$ is a tetravalent organic group, and $R_3$ and X are bivalent organic groups, m is an integer of 1 or more, n is an integer of 0 or more, and $R_1$ indicates one or more tetravalent organic groups selected from the group represented by the formula:

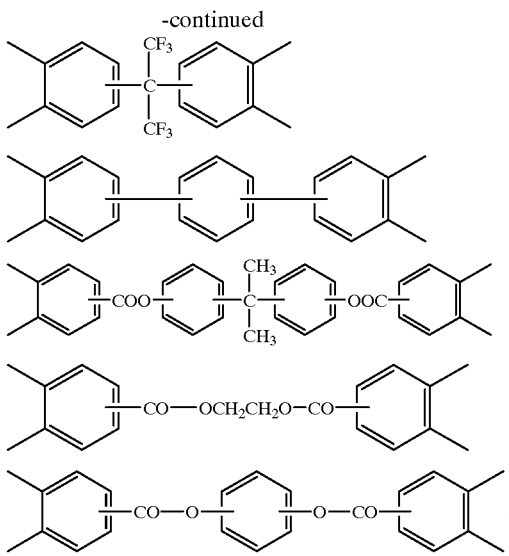

3. Polyimide composition having a water absorption rate of 1.6% or less and a hygroscopic swelling coefficient of 15 ppm or less, and comprising polyimide consisting of a repeating unit of the general formula (1):

(1)

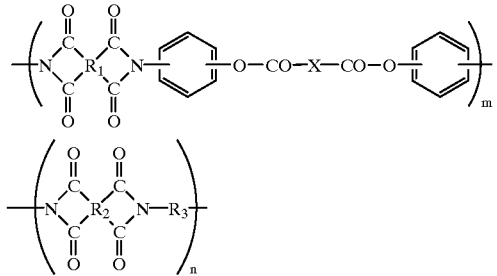

wherein $R_3$ and X are bivalent organic groups, $R_1$ indicates one or more tetravalent organic groups selected from the group represented by the formula:

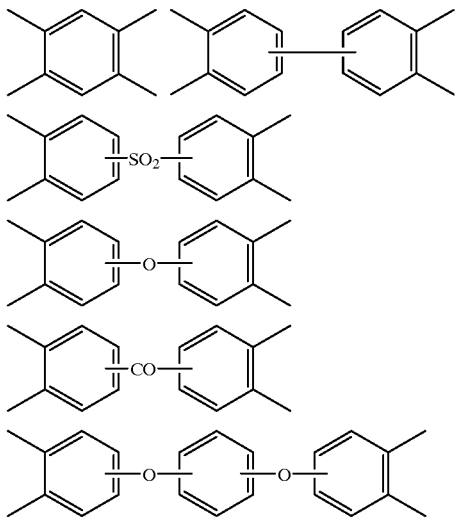

-continued

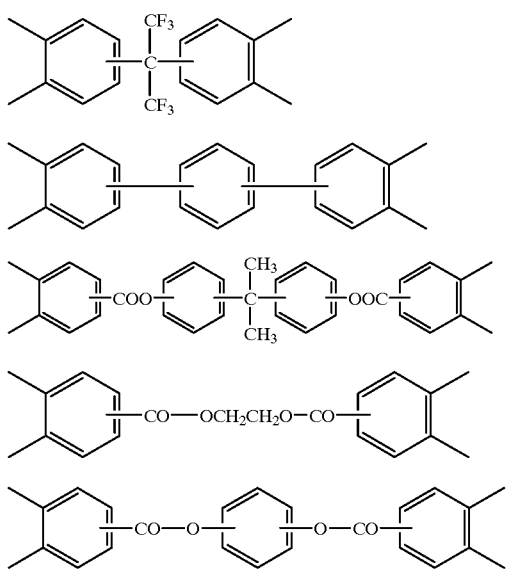

R₂ indicates one or more tetravalent organic groups selected from the group represented by the formula:

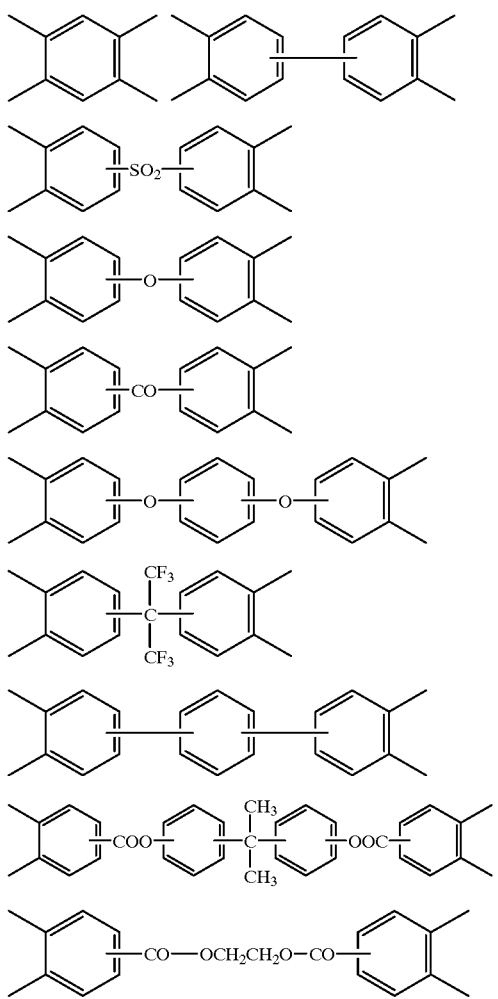

-continued

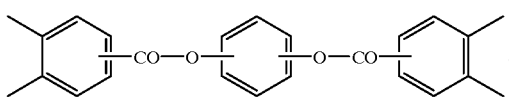

and m is an integer of 1 or more, n is an integer of 0 or more.

4. Polyimide composition having a water absorption rate of 1.6% or less and a hygroscopic swelling coefficient of 15 ppm or less, and comprising polyimide consisting of a repeating unit of the general formula (1):

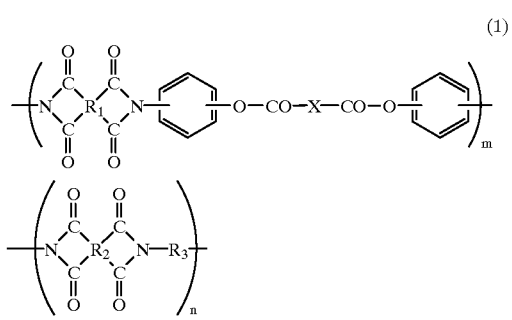

(1)

wherein $R_3$ is a bivalent organic group, $R_1$ indicates one or more tetravalent organic groups selected from the group represented by the formula:

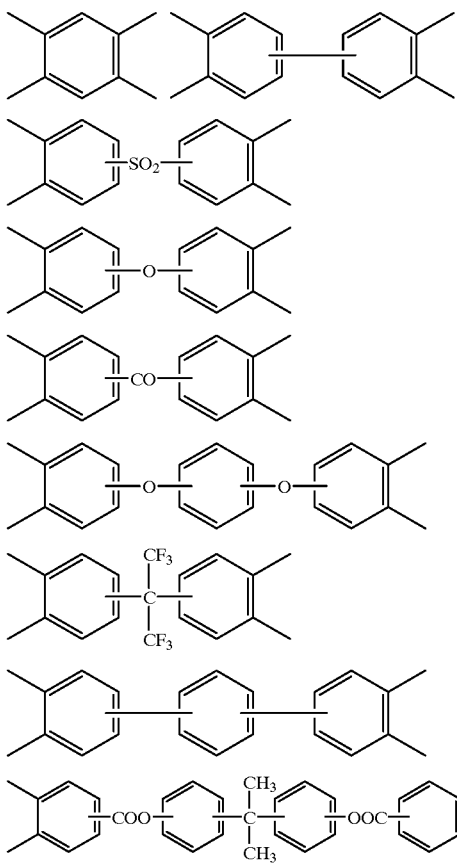

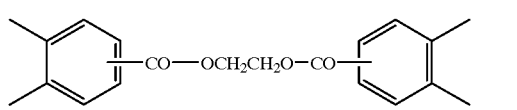
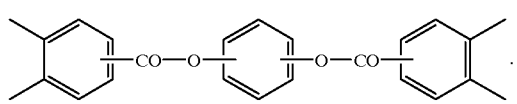

R₂ indicates one or more tetravalent organic groups selected from the group represented by the formula:

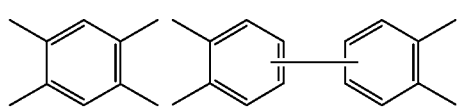
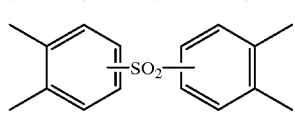
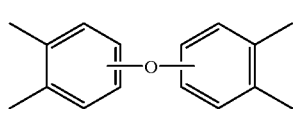
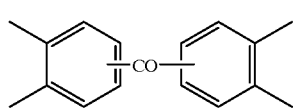
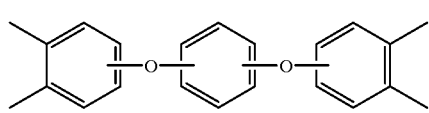
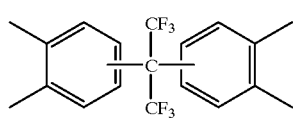
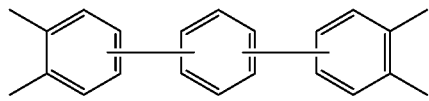
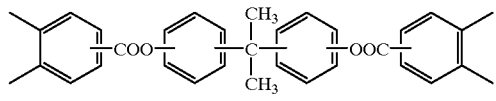
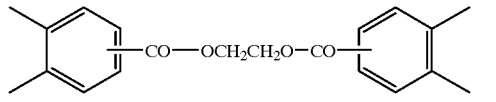
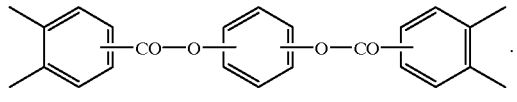

X indicates one or more organic groups selected by the formula:

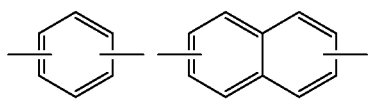

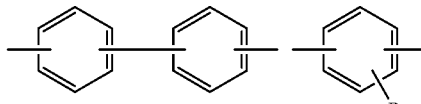
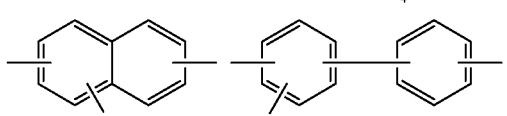
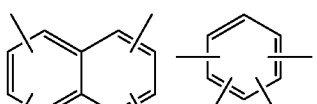
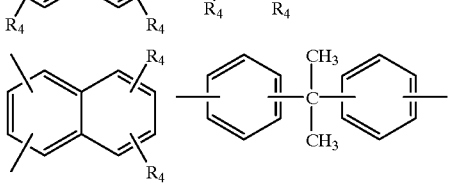
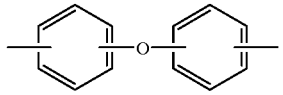
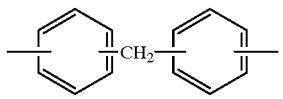
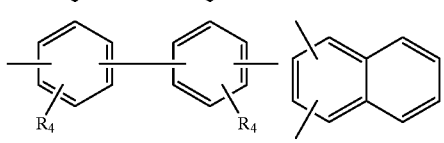
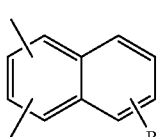

($R_4$: F, Cl, Br, $CH_3$–, $CH_3$ O–)

m is an integer of 1 or more, and n is an integer of 0 or more.

5. Polyimide composition having a water absorption rate of 1.6% or less and a hygroscopic swelling coefficient of 15 ppm or less, and comprising polyimide consisting of a repeating unit of the general formula (1):

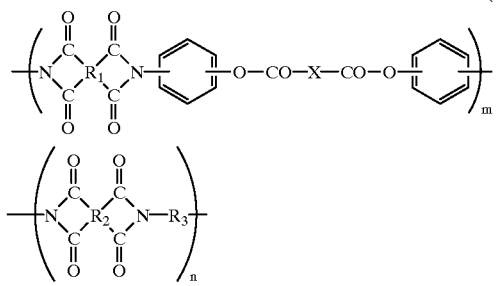

(1)

wherein $R_1$ indicates one or more tetravalent organic groups represented by the formula:

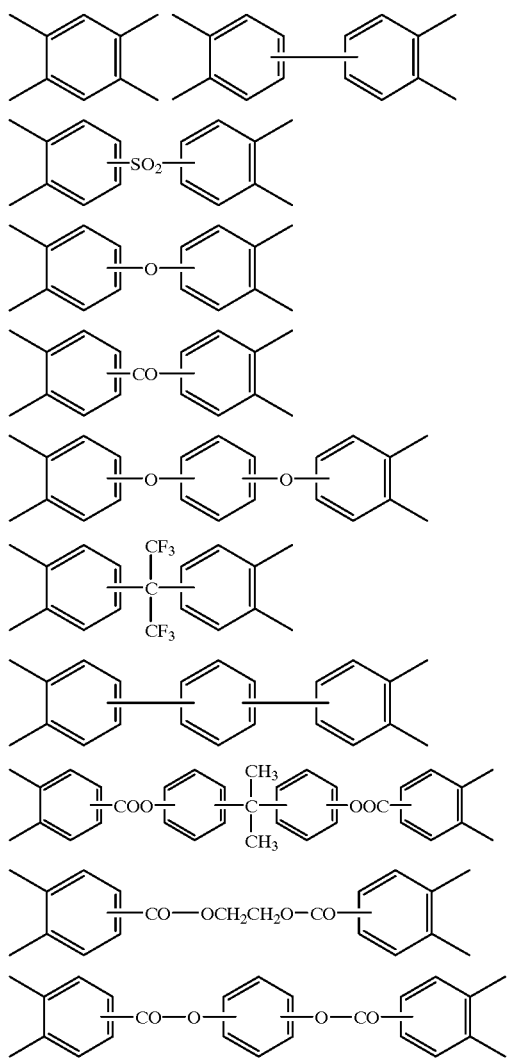
$R_2$ indicates one or more tetravalent organic groups represented by the formula:
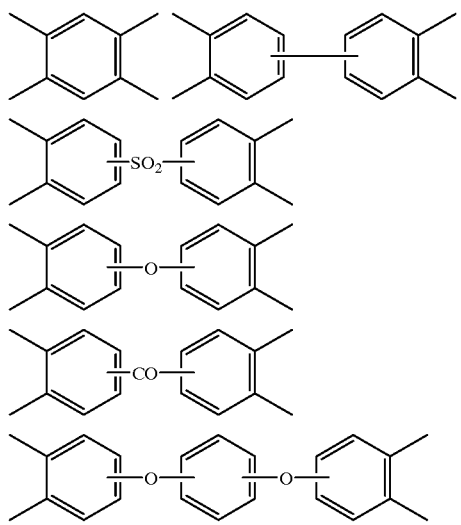
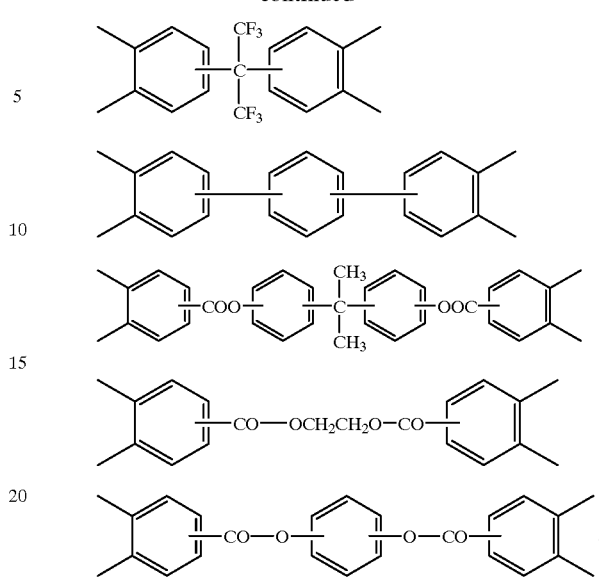
X is one or more organic groups represented by the formula:
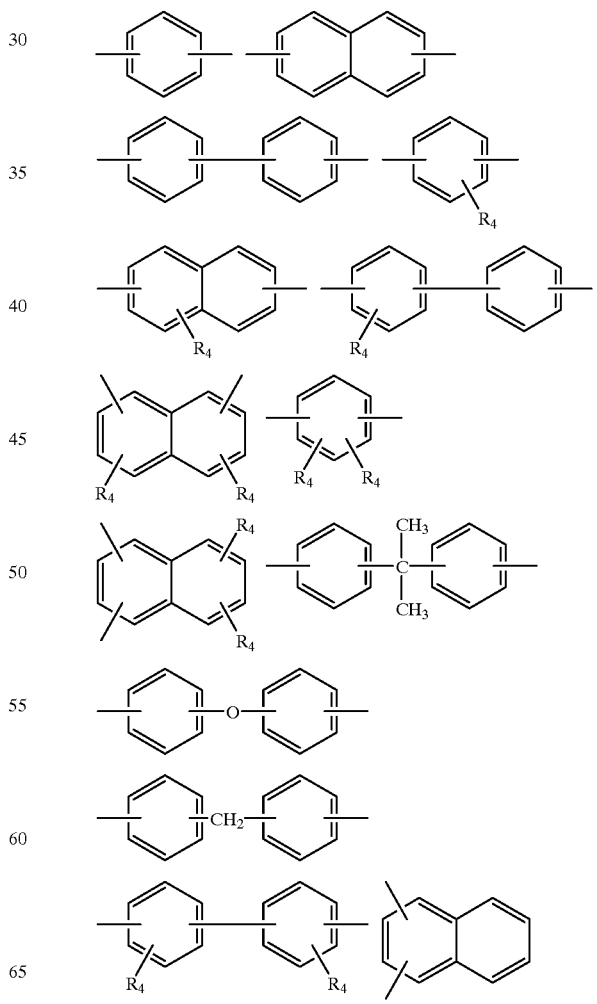

-continued

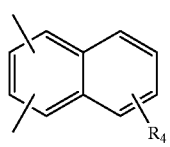

(R$_4$: F, Cl, Br, CH$_3$–, CH$_3$O–)

R$_3$ indicates one or more bivalent organic groups represented by the formula:

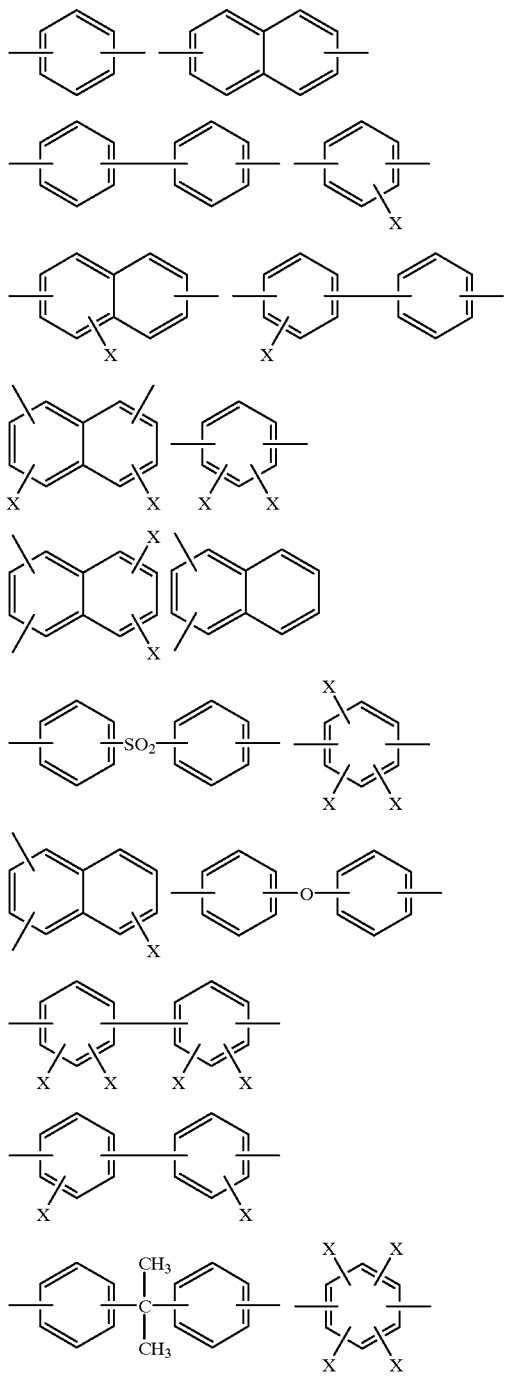

-continued

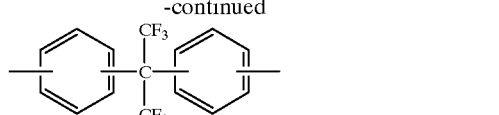

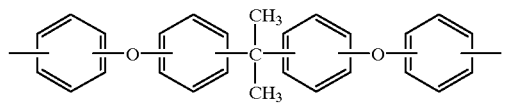

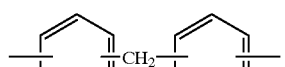

and

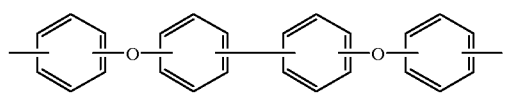

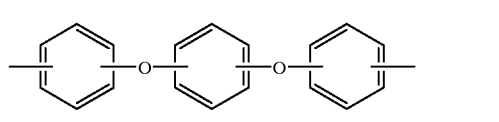

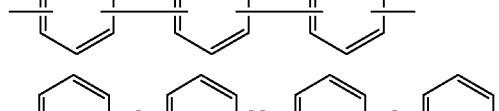

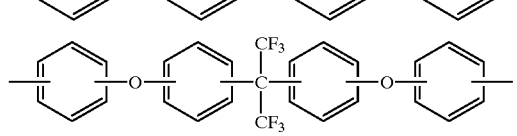

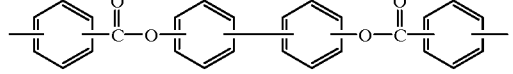

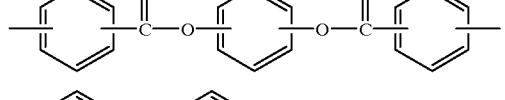

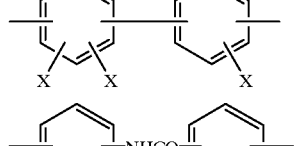

(X: F, Cl, Br, CH$_3$–, CH$_3$O–)

m is an integer of 1 or more, and n is an integer of 0 or more.

6. Polyimide film comprising one of polyimide compositions according to any one of claims 1 to 5.

7. A base tape for a TAB carrier tape comprising polyimide film according to claim 6, an adhesive layer and a protective layer on the surface of said polyimide film.

8. A Flexible printed circuit board comprising at least a conductor and an insulating material consisting of polyimide film according to claim 6.

* * * * *